United States Patent
Fujisawa et al.

(10) Patent No.: US 6,762,949 B2
(45) Date of Patent: Jul. 13, 2004

(54) DYNAMIC RAM-AND SEMICONDUCTOR DEVICE

(75) Inventors: Hiroki Fujisawa, Ome (JP); Riichiro Takemura, Tokyo (JP); Koji Arai, Kodaira (JP)

(73) Assignees: Hitachi, Ltd., Tokyo (JP); Hitachi ULSI System Co., Ltd., Tokyo (JP)

( * ) Notice: Subject to any disclaimer, the term of this patent is extended or adjusted under 35 U.S.C. 154(b) by 0 days.

(21) Appl. No.: 10/627,713

(22) Filed: Jul. 28, 2003

(65) Prior Publication Data

US 2004/0017716 A1 Jan. 29, 2004

Related U.S. Application Data

(60) Continuation of application No. 10/361,642, filed on Feb. 11, 2003, now Pat. No. 6,639,822, which is a continuation of application No. 10/084,514, filed on Feb. 28, 2002, now Pat. No. 6,545,897, which is a continuation of application No. 09/805,167, filed on Mar. 14, 2001, now Pat. No. 6,373,776, which is a division of application No. 09/705,837, filed on Nov. 6, 2000, now Pat. No. 6,370,054.

(30) Foreign Application Priority Data

Nov. 4, 1999 (JP) .......................................... 11-314225

(51) Int. Cl.$^7$ ................................................. G11C 5/06
(52) U.S. Cl. ................ 365/63; 365/230.03; 365/230.08
(58) Field of Search ............................ 365/63, 51, 205, 365/207, 230.03, 230.08

(56) References Cited

U.S. PATENT DOCUMENTS

| 5,369,619 | A | * | 11/1994 | Ohba ..................... 365/230.03 |
| 5,646,900 | A | | 7/1997 | Tsukude et al. ............ 365/205 |
| 5,838,627 | A | * | 11/1998 | Tomishima et al. ..... 365/230.03 |
| 5,886,943 | A | | 3/1999 | Sekiguchi et al. ...... 365/230.03 |
| 6,125,070 | A | | 9/2000 | Tomishima ............ 365/230.03 |
| 6,272,066 | B1 | | 8/2001 | Ooishi ........................ 365/233 |
| 6,310,815 | B1 | * | 10/2001 | Yamagata et al. ..... 365/230.03 |

FOREIGN PATENT DOCUMENTS

| JP | 63206991 | 8/1988 |
| JP | 6413290 | 1/1989 |
| JP | 541081 | 2/1993 |

* cited by examiner

Primary Examiner—Richard Elms
Assistant Examiner—Hien Nguyen
(74) Attorney, Agent, or Firm—Antonelli, Terry, Stout & Kraus, LLP

(57) ABSTRACT

A semiconductor memory includes a plurality of memory arrays and a plurality of sense amplifiers arranged alternately with respect to each of the memory arrays. The sense amplifiers are coupled to bit lines of the memory arrays to form an open bit line type semiconductor memory. In conjunction with this structure, two memory arrays at end portions of the semiconductor memory device are both selected together, whereas a memory array in an inner portion of the semiconductor memory device is selected independently.

3 Claims, 26 Drawing Sheets

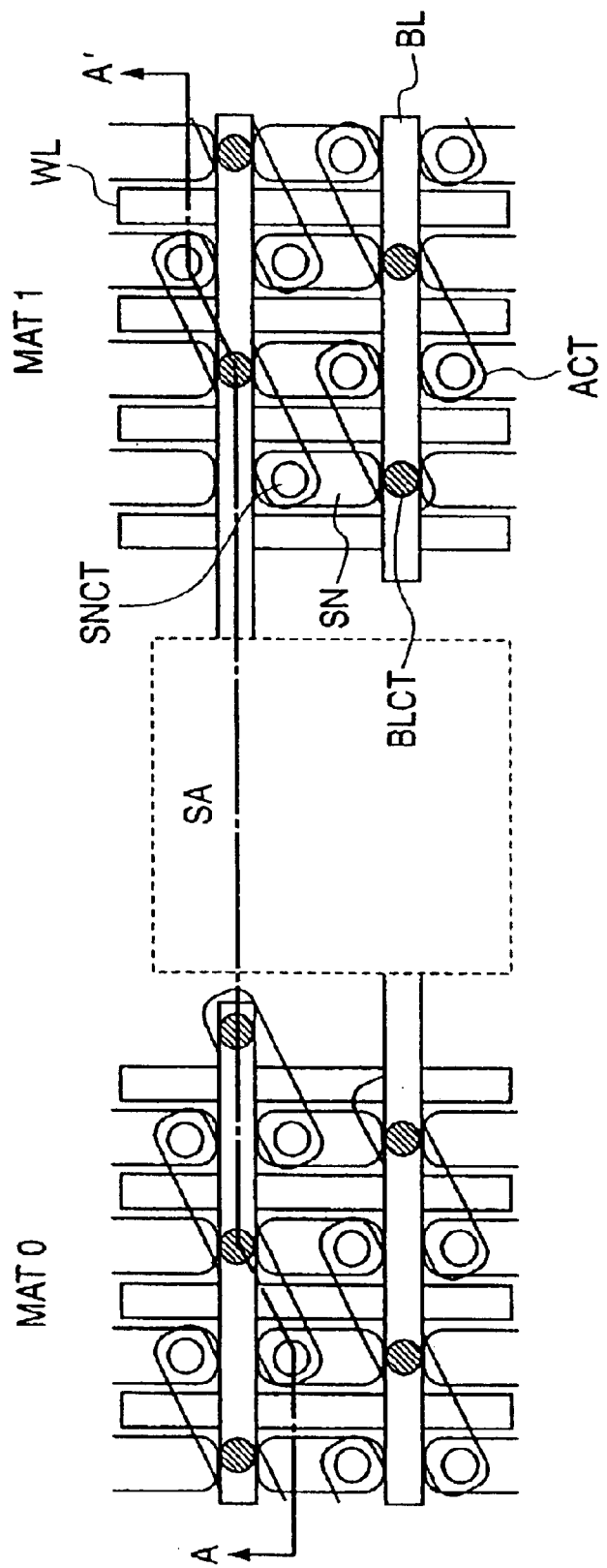

IN ACCESSING GENERAL MAT 0:
SWD BLOCK 1 : ACTIVATED
SA BLOCKS 0,1 : ACTIVATED

IN ACCESSING END MAT :
SWD BLOCKS 0,3 : CONCURRENTLY ACTIVATED
SA BLOCKS 0,2 : ACTIVATED

GENERAL MAT MWD CIRCUIT EXAMPLE

END MAT MWD CIRCUIT EXAMPLE

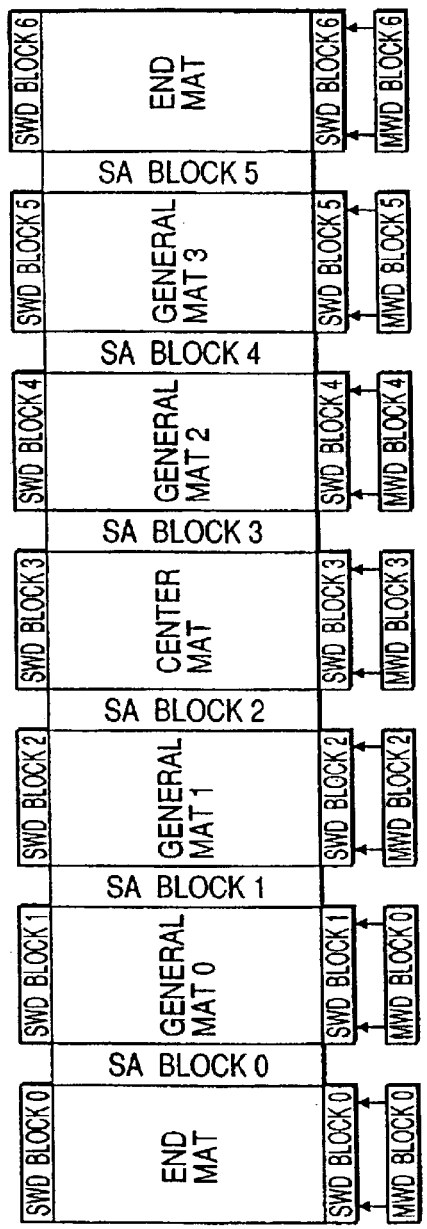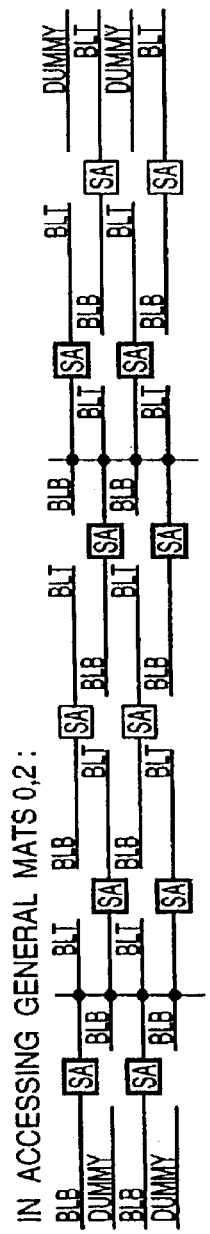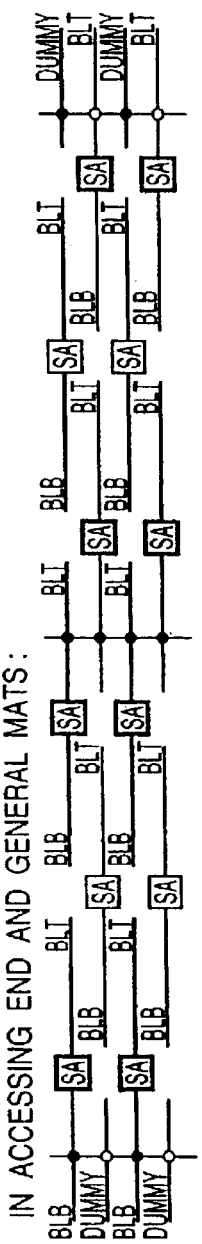
FIG. 6A
FIG. 6B
FIG. 6C

DELAYS FOR ALLOCATING BLEQ/
SHR⇔SWL TIMING MARGIN ARE REQUIRED:

NO DELAYS FOR ALLOCATING BLEQ⇔SWL TIMING
MARGIN ARE REQUIRED:

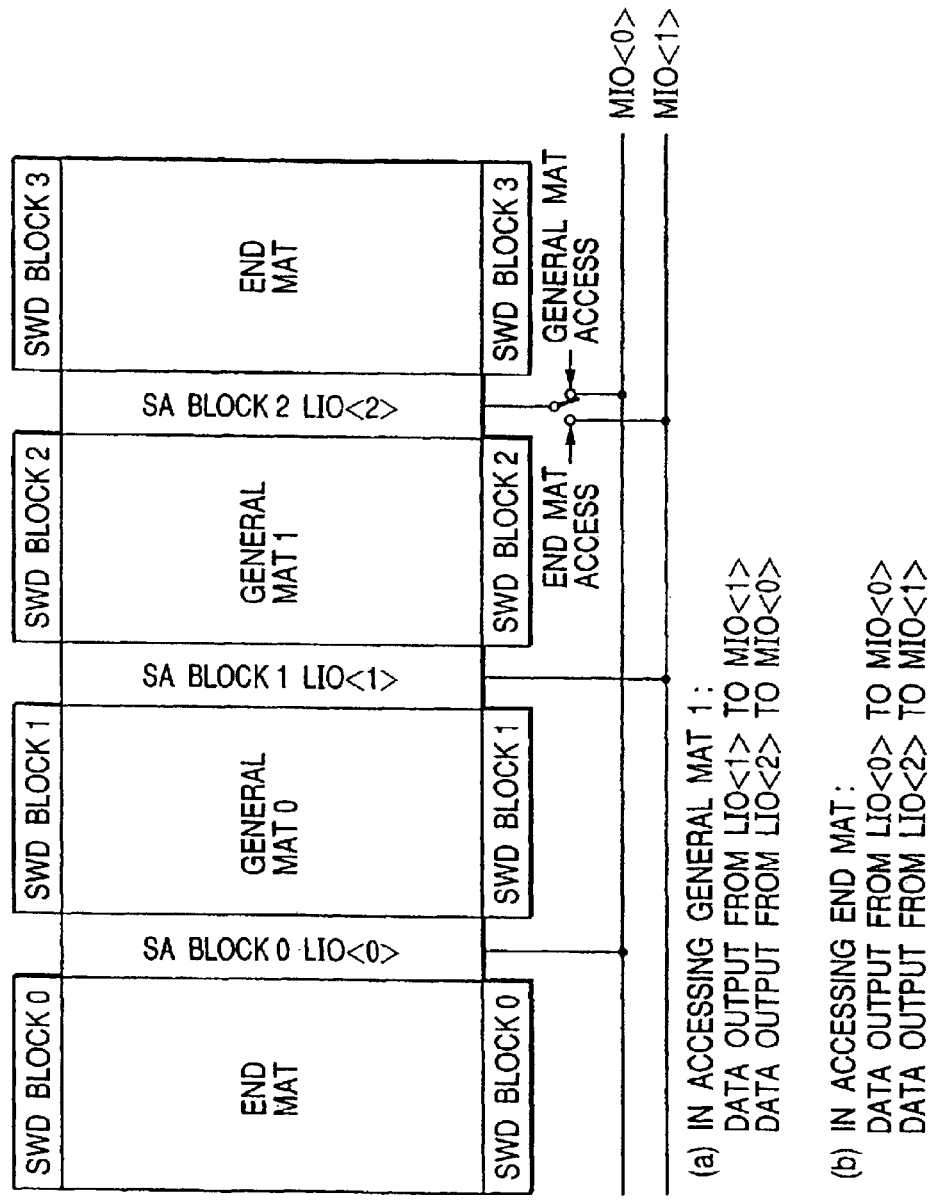

GENERAL MATS ON BOTH SIDES

END MAT ON ONE SIDE

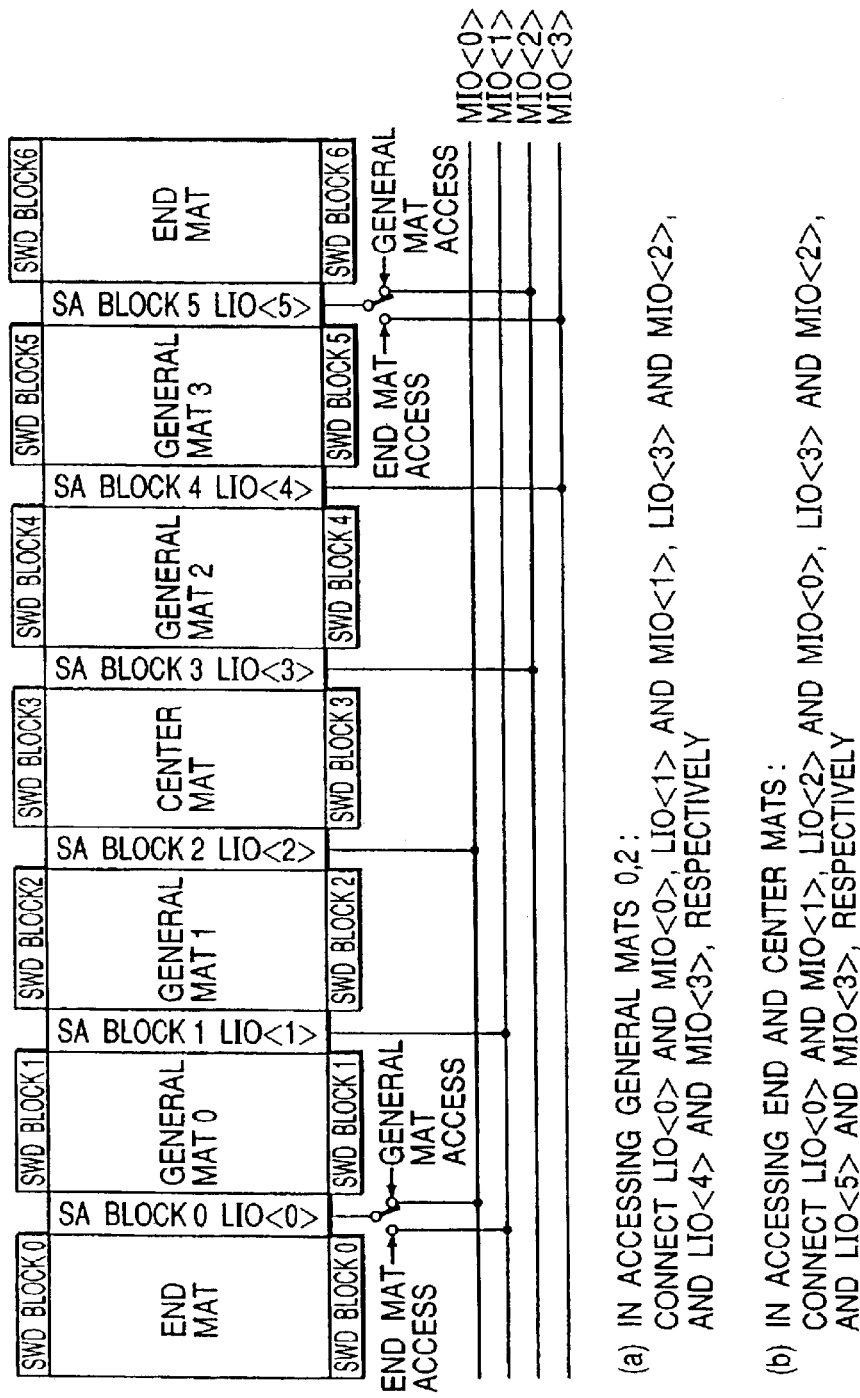

SIMPLE 1 CROSS POINT SENSE AMPLIFIER ALTERNATELY ARRANGED ARRAY

PROPOSED FOLDED TYPE ARRAY

FG-USED TYPE

M1 PHASE SHIFT ADDRESSING TYPE

CROSS-SECTION 1—1'

CROSS-SECTION 2—2'

DYNAMIC RAM AND SEMICONDUCTOR DEVICE

CROSS-REFERENCE TO RELATED APPLICATIONS

This is a Continuation application of Ser. No. 10/361,642, filed Feb. 11, 2003, (now U.S. Pat. No. 6,639,822), which is a Continuation of application Ser. No. 10/084,514 filed Feb. 28, 2002 (now U.S. Pat. No. 6,545,897), which is a Continuation of application Ser. No. 09/805,167, filed Mar. 14, 2001 (now U.S. Pat. No. 6,373,776), which is a Divisional of application Ser. No. 09/705,837, filed Nov. 6, 2000 (now U.S. Pat. No. 6,370,054), the entire disclosures of which are hereby incorporated by reference.

BACKGROUND OF THE INVENTION

This invention relates to a dynamic random access memory (RAM) and a semiconductor device and more particularly, the invention relates to an effective technique using a so-called one cross point method where a dynamic memory cell is arranged at a cross point of a word line and a bit line.

According to a search conducted after this invention was made, some publications which might be related to the technology of the present invention, to be described later as an open bit line type (or one cross point method) dynamic RAM, were found, including Japanese Patent Laid-Open No. 206991/1988 (related art 1, hereinafter), Japanese Patent Laid-Open No. 13290/1989 (related art 2, hereinafter), U.S. Pat. No. 5,608,668 (related art 3, hereinafter), and Japanese Patent Laid-Open No. 41081/1993 (related art 4, hereinafter). According to related arts 1 and 2, one sense amplifier is fitted into a pitch for two bit lines by positioning sense amplifies alternately, based on the open bit line method (one-cross point method). According to related arts 3 and 4, there is provided a circuit achieving, based on an electrical model which is substantially the same as a bit line, for achieving a reference voltage required for an operation by a sense amplifier provided at an end portion in a case where sense amplifiers are positioned alternately for more efficient use of a chip area, as in the related arts 1 and 2.

SUMMARY OF THE INVENTION

Due to process variations, which will increase with an increase in micronization of elements, operational conditions are expected to differ largely between a sense-amplifier at the end portion and a sense amplifier to which bit lines are equipped on both sides. Thus, according to reviews by the inventor hereof, it was found that the need for operational stability will become more and more important. In the related arts 1 and 2, no considerations are made for the arrangement at the end portion in a case where sense amplifiers were arranged alternately with respect to the bit lines.

Further, a cost reduction has been desired for the dynamic RAM (DRAM, hereinafter). In order to achieve such a cost reduction, reducing the chip sizes may be the most effective answer. The size of a memory cell has been reduced by promoting its micronization. However, it will be necessary to further reduce the cell size by changing the operating method of memory arrays from now on. By changing the memory array operating method from the two cross point method to the one cross point method, the cell size can be reduced 75% ideally based on the same design rule. In order to achieve a cell size reduction more effectively, the inventor hereof considered effective uses of memory cells provided at the end portion and the reduction of their area of occupation when the sense amplifiers are arranged alternately in the memory array according to the one cross point method as described above.

It is an object of the present invention to provide a DRAM and a semiconductor device based on the one cross point method which can achieve an improvement of operational margins and a reduction of the chip area. The above and other objects and new features of the present invention will be apparent from the description in this specification and the accompanying drawings.

An outline of a typical aspect of the present invention disclosed herein may be described in brief as follows. There is provided a plurality of memory mats, including a plurality of bit lines, a plurality of word lines, and a plurality of memory cells coupled to the plurality of bit lines and the plurality of word lines, the plurality of memory mats being placed in the direction of a bit line, and a sense amplifier array including a plurality of latch circuits are provided in areas between the memory mats placed in the bit line direction, respectively, a pair of input/output nodes of which are connected to half of the bit lines provided in the memory mats. In this case, for a general memory mat, other than both end portions in the bit line direction, the word lines in any one of the memory mats are activated, while, for end memory mats provided on both end portions in the bit line direction, the word lines of both memory mats are activated together.

BRIEF DESCRIPTION OF THE DRAWINGS

FIG. 3A diagrams schematically shows one embodiment of a memory cell array in the DRAM according to the present invention.

FIGS. 6A, 6B and 6C are diagrams schematically showing another embodiment of the word system control operation of the DRAM according to the present invention;

FIG. 10 is a block diagram showing one embodiment of an I/O circuit of the DRAM according to the present invention;

FIG. 12 is a block diagram showing another embodiment of an I/O circuit of the DRAM according to the present invention;

DETAILED DESCRIPTION OF THE INVENTION

Figure 1:
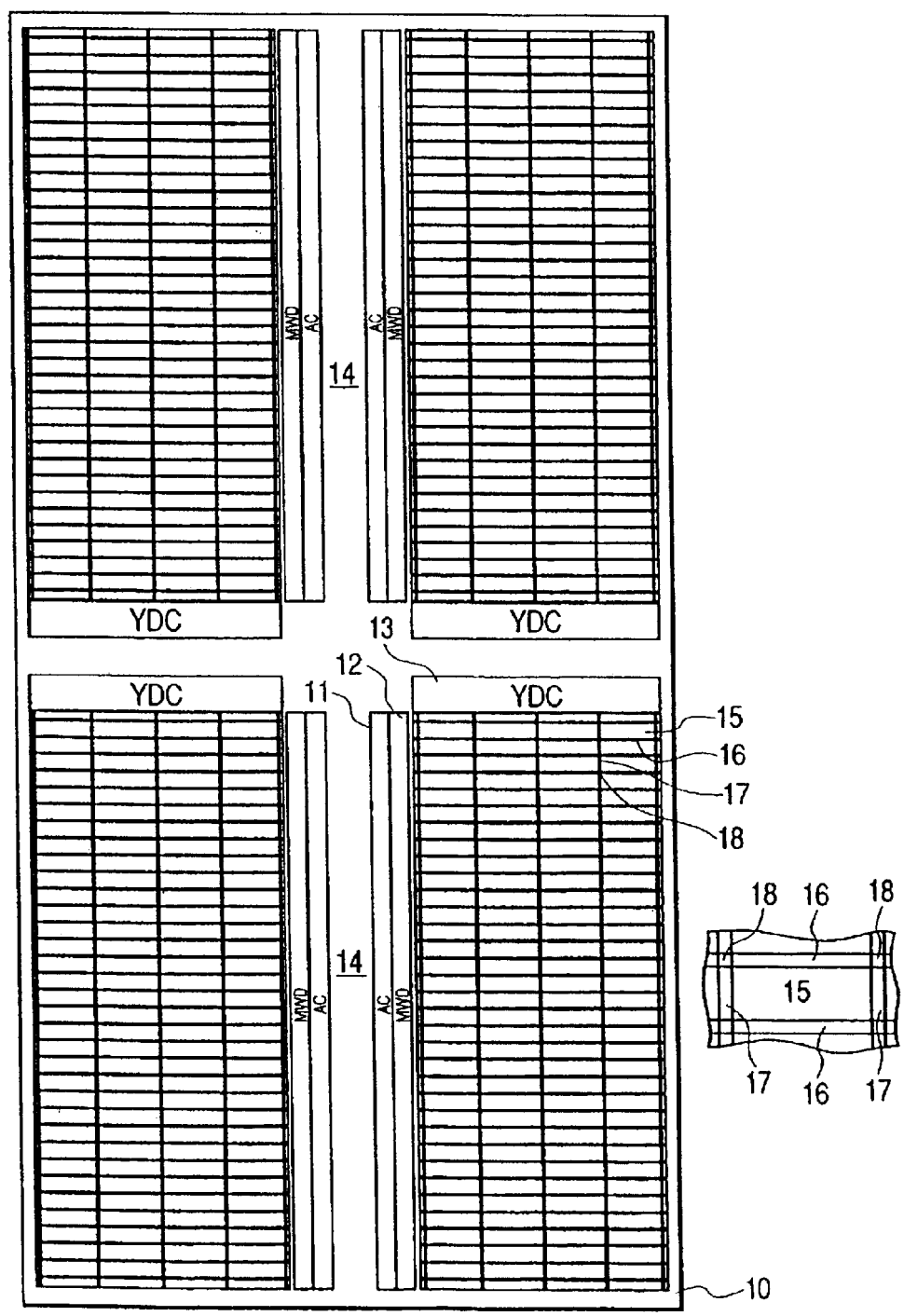
FIG. 1 is a schematic layout diagram showing one embodiment of a DRAM to which the present invention is applied.

FIG. 1 is a schematic layout diagram of one embodiment of a dynamic RAM, DRAM, to which the present invention is applied. In FIG. 1, a main part is emphasized among individual circuits constituting the DRAM to which the present invention is applied, and it is formed over one semiconductor substrate of single crystal silicon based on known technology for manufacturing a semiconductor integrated circuit, for example.

In this embodiment, a memory array can be divided into, but not limited to, four parts as a whole. They can be separated to the left and the right with respect to the longitudinal direction of a semiconductor chip. Provided on a center part 14 are an address input circuit, an input/output interface circuit having a data input/output circuit and a bonding pad array and power supply circuits including step-up and step-down circuits. A memory array control circuit (AC) 11 and a main word driver (MWD) 12 are positioned in a part contact with the memory arrays on both sides of the center part 14. The memory array control circuit 11 has a control circuit and a main amplifier for driving a sub-word select line and/or a sense amplifier. A column decoder area (YDC) 13 is provided at a vertical center part about the longitudinal direction in each memory array divided into four, that is, two above and two below or two on the left and two on the right, with respect to the longitudinal direction of the semiconductor chip, as described above.

In each of the memory arrays, the main word driver 12 forms select signals for a main word line which extends through one corresponding memory array. A driver for a sub-word select line for sub-word selection is provided in the main word driver area 12 and generates a select signal for the sub-word select line which extends in parallel with the main word line, as will be described later. The column decoder 13 generates a select signal for a column select line which extends through one corresponding memory array.

Each of the memory arrays is divided into a plurality of memory cell arrays (memory mats, hereinafter) 15. As shown in its magnified view, the memory mat 15 is formed so as to be surrounded by sense amplifier areas 16 and sub-word driver areas 17. A part where the sense amplifier area 16 and the sub-word driver area 17 cross is called a cross area 18. A sense amplifier provided in the sense amplifier area 16 is constituted by a latch circuit in the CMOS configuration and is of a so-called one cross point method or open bit line type, which amplifies signals of complementary bit lines extended to the right and the left with respect, to the sense amplifier. The sense amplifiers are positioned alternately with respect to the bit lines. Thus, the bit line provided in the memory mat is divided in half and allocated alternately to two sense amplifier arrays sandwiching them.

One memory mat 15 shown in the magnified view includes 512 sub-word lines (word lines) and 1024 data lines, that is one of the complementary bit lines orthogonal to them. In one of the memory arrays, 32 memory mats 15 are provided as regular mats and two memory mats 15 are provided as redundant mats in the direction the bit lines extend. Since the redundancy memory mats, or end memory mats, have half of the memory cells, as will be described later, two end memory mats are needed to be equivalent to one. The end memory mats may be used for reference. In this case, one memory mat is allocated for redundancy.

Since the memory mat 15 is provided with a pair of complementary bit lines with the sense amplifier 16 as its center, the bit lines are divided essentially into 16 by the memory mats 15 in the bit line extending direction. Further, four of the memory mats 15 are provided in the word line extending direction. Thus, in the word line extending direction, the sub-word line is divided into four by the memory mats 15.

In one memory mat 15, there are provided 1024 bit lines, except for the end memory mats, and, therefore, memory cells equal to about 4K are connected thereto in the word line direction. Further, there are provided 512 sub-word lines, and, therefore, memory cells equal to 512×32=16K are connected thereto in the bit line direction. Accordingly, one memory array has a memory capacity that amounts to 4K×16 k=64M bits, and so four memory arrays have a memory capacity that amounts to 4×64M=256M bits.

It should be understood that the term "MOS" herein originally and simply refers to a metal oxide semiconductor configuration. However, these days, the term MOS generally includes a device in which the metal of essential parts of a semiconductor device is replaced by a non-metal electrical conductor, such as poly-silicon, or where an oxide is replaced by another insulator. Also, the term CMOS. is understood as having a wide technical meaning depending on the variation of what MOS refers to, as described above. The term MOSFET is also understood as having a wide meaning. Virtually, the term MOSFET has recently become understood as including a configuration in a broad sense, which can be considered as an insulating gate field effect transistor. The terms CMOS and MOSFET herein are based on those general meanings.

Figure 2A:
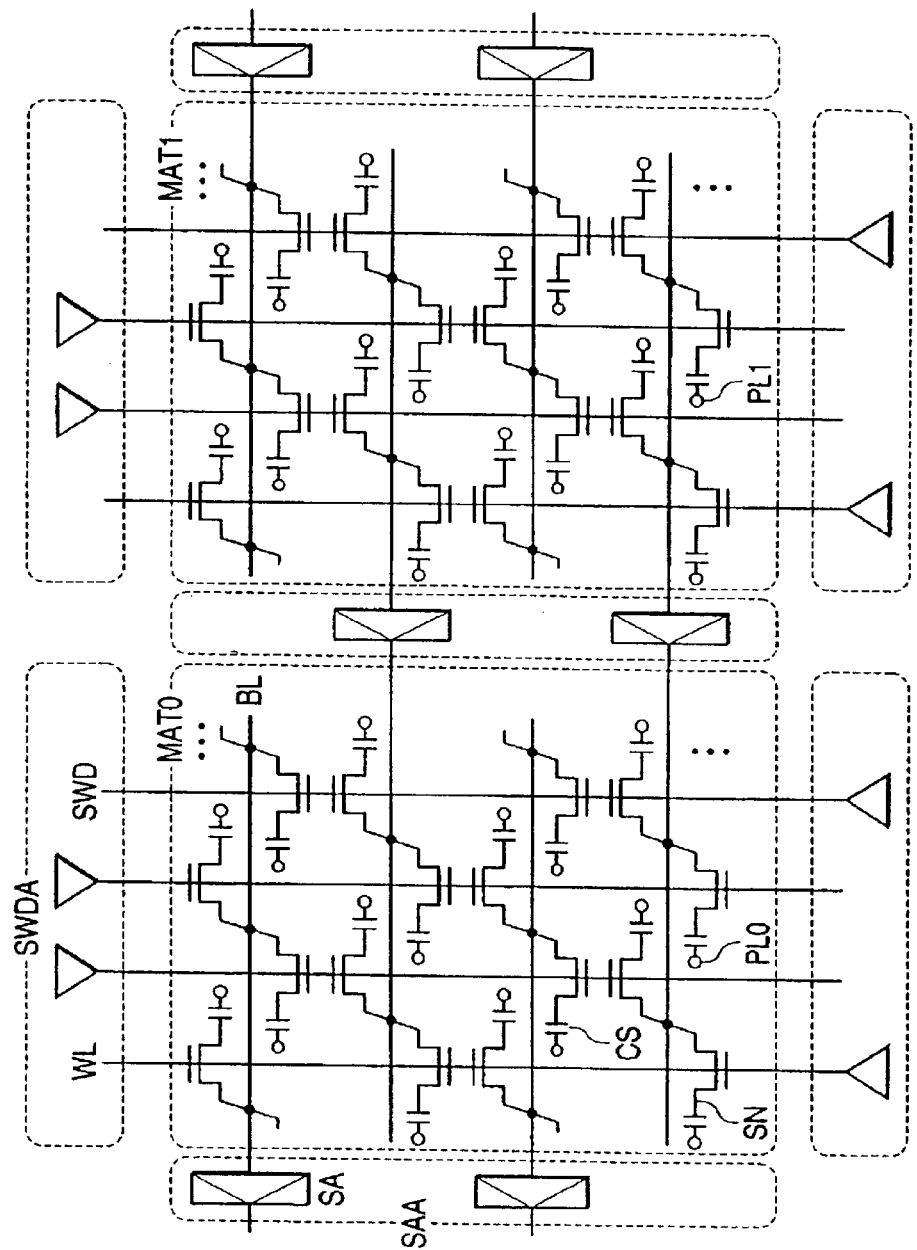
FIGS. 2A and 2B are diagrams schematically showing one embodiment of the memory mats of the DRAM according to the present invention.
Figure 2B:
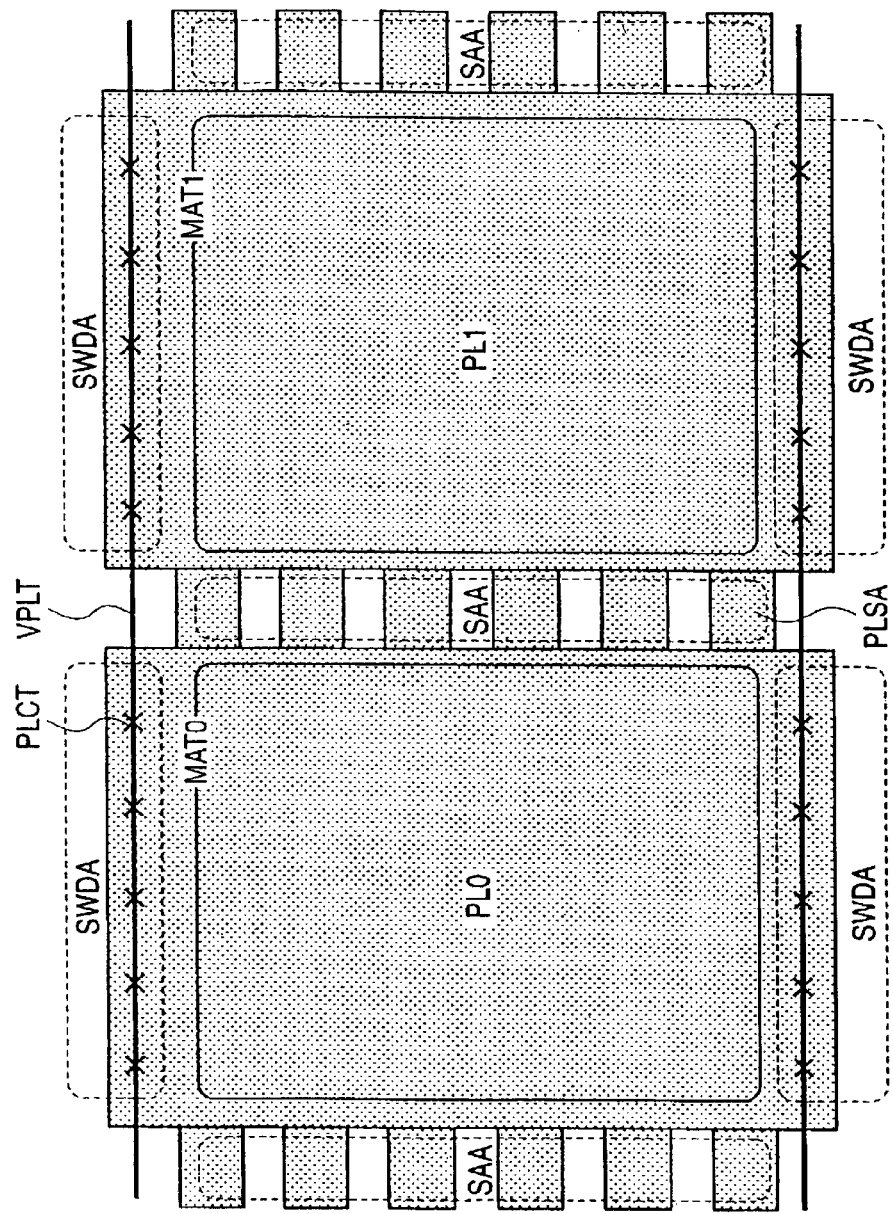

FIGS. 2A and 2B show diagrams of one embodiment of memory mats of a dynamic RAM, DRAM, according to the present invention. FIG. 2A shows circuits corresponding to two memory mats MAT0 and MAT1 equipped in a hierarchical word line method DRAM as shown in FIG. 1. FIG. 2B shows a layout corresponding to them. In FIG. 2A, a memory cell MC including a MOSFET and a cell storage CS is connected to each of all cross points of a bit line BL and a sub-word line WL. A sense amplifier SA is connected to the bit line BL, while a sub-word driver SWD is connected to the word line WL.

In this embodiment, in order to reduce t e number of main word lines, or in other words, in order to moderate the wiring pitch of the main word line, four sub-word lines in the direction of the complementary bit line, but not limited thereto, are positioned for one main word line, as will be described later. A sub-word select driver is positioned in the direction of the main word line in order to select one sub-word line among those sub-word lines, which are divided in two in the main word line direction, as shown in FIG. 1, and four of which are al located toward the complementary bit line direction, respectively. The sub-word select driver forms a select signal for selecting one from four sub-word select lines which extend toward the direction of the sub-word driver arrangement (sub-word driver array SWDA). The main word line MWL is extended in parallel with the sub-word line WL, not shown. The column select line YS is positioned in parallel with the bit line BL extended direction orthogonal thereto, not shown.

Sense amplifiers SA in a sense amplifier array SAA provided between the two memory mats, MAT0 and MAT1, are connected to the complementary bit lines extending to both sides of the two memory mats, MAT0 and MAT1. One sense amplifier SA of these sense amplifiers SA is positioned for, but not limited to, each two bit lines in the sense amplifier array SAA. Therefore, in case there are 1024 bit lines BL as indicated above, 512 (half of 1024) sense amplifiers SA are provided in the sense amplifier array SAA provided between the memory mats MAT0 and MAT1.

In the memory mat MAT0, the remaining 512 bit lines are connected to the sense amplifiers SA provided.in the sense amplifier array SAA, which is the opposite side of the memory mat MAT1. In the memory mat MAT1, the remaining 512 bit lines are connected to the sense amplifiers SA provided in the sense amplifier array SAA provided in the opposite side of the memory mat MAT0. When sense amplifiers SA are distributed on both sides in the bit line direction, one sense amplifier may be formed for every two bit lines separately and alternately on both ends thereof. Thus, the sense amplifier SA and the bit line BL can be matched in pitch in order to form memory mats and sense amplifier arrays with higher density.

This is the same in the sub-word driver SWD. 512 sub-word lines WL provided in the memory mat MAT0 are divided into 256 each and connected to the 256 sub-word drivers SWD in the sub-word driver array SWDA positioned on both sides of the memory mat MAT. In this embodiment, two sub-word lines WL are used as one pair and every two sub-word drivers SWD are distributed. In other words, the sub-word lines corresponding to two memory cells, which have a common connection portion to the bit lines, are used as one set and two sub-word drivers are positioned at one end of the memory mat MAT0 (upper side of FIG. 2A). Two sub-word lines similar to the above and adjacent to them are also used as one set and positioned at the other end of the memory mat MAT0 (lower side of FIG. 2A).

The sub-word driver SWD, not shown, generates a select signal for the sub-word line of the memory mats provided on both sides sandwiching the sub-word driver array SWDA in which the sub-word driver SWD is formed. Thus, the sub-word driver SWD may be distributed efficiently based on the sub-word line formed in accordance with the memory cell arrangement pitch. Further, the sub-word line WL can be selected faster.

A memory cell MC is formed at each cross point of a bit line BL and a sub-word line WL in the memory cell arrays (or memory mats) MAT0 and MAT1 surrounded by the sub-word driver array SWDA and the sense amplifier array SAAL for example. In the memory mat MAT0 in which each of the memory cells MC is formed, as shown in FIG. 2B, an upper electrode (plate electrode) PL in the storage capacitor CS is a flat electrode formed commonly in all of the memory cells MC within the memory mats MAT0 and MAT1. The plate electrode PL is fed at the border of the sub-word driver array SWDA and memory mats MAT0, MAT1 from a power supply wiring VPLT wired in the bit line BL extending direction through the connection point PLCT. In FIG. 2A, the storage node SN is a bottom electrode of the storage capacitor CS and the connection point with an address select MOSFET is shown.

In this embodiment, as shown in FIG. 2B, the plate electrodes PL0 and PL1 as above formed in the memory mats MAT0, MAT1, respectively, which exist on both sides of the sense amplifier array SAA are connected to each other through a wire PLSA using the plate layer itself. Further, a plurality of wires PLSA are provided through the sense amplifier array SAA in order to reduce the resistance between the two plate electrodes PL0 and PL1 significantly. Thus, when micro-signals read out from the memory cell MC selected between the complementary bit lines BL of the memory mats MAT0 and MAT1 are amplified by the sense amplifier SA, noises which have opposite phases relative to each other generated in the plate electrodes PL0 and PL1 can be canceled rapidly, which allows for a significant reduction of the noises caused in the plate electrodes PL0 and PL1.

Figure 3B:
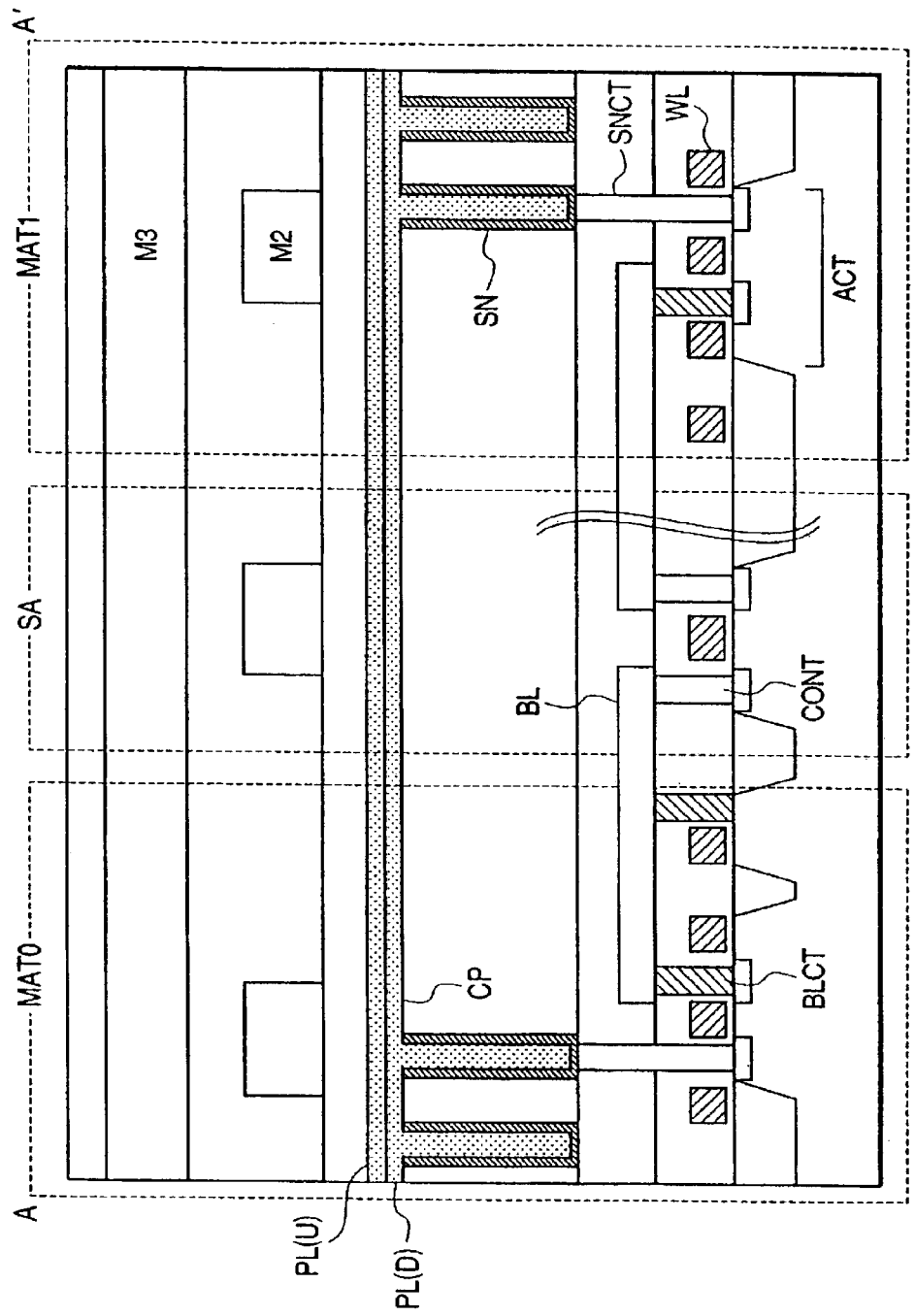
FIG. 3B is a section view taken along line A–A' in FIG. 3A.

FIGS. 3A and 3B show illustrative diagrams of one embodiment of,a memory cell array in a DRAM according to the present invention. FIG. 3A shows a layout of memory cell arrays in two memory mats MAT0 and MAT1. FIG. 3B shows an element cross section taken on line A–A' in FIG. 3A. In FIG. 3A, layout and cross section of a sense amplifier SA area provided between the MAT0 and MAT1 are omitted.

The memory cell array includes active regions ACT of the MOSFET, a connection point (contact) SNCT for connecting between a storage node SN of the memory cell and a source/drain diffusion layer corresponding to the storage node SN of the MOSFET formed in the active region ACT, and a connection point (contact) BLCT for connecting between a bit line BL and a source/drain diffusion region corresponding to an input/output terminal of the memory cell corresponding to the bit line BL of the MOSFET formed in the active region ACT. The structure shown in FIG. 3B further includes a capacitance insulating layer of a memory capacitor. Here, a first mdtal layer M1 and a bit line BL are in the same wiring layer and a first poly-silicon layer FG and a sub-word line WL are on another wiring layer.

As shown in FIG. 3B, the plate electrode PL of the memory mats MAT0 and MAT1 provided on both sides of the sense amplifier SA does not terminate on the sense amplifier SA, but is connected through an electrode itself constituting the plate electrode PL. Thus, the resistance between the plate electrode PL of the memory mat MAT0 and the plate electrode PL of the memory mat MAT1 can be reduced significantly. The COB (Capacitor over Bitline) structure is used for the memory cell. That is, a storage node SN is provided on the bit line BL. Thus, the plate electrode PL is not divided in the memory mat MAT by the bit line BL and the connection point BLCT of the address select MOSFET, and one flat plane can be formed. Therefore, the resistance between the plate electrodes can be reduced.

In this embodiment, as shown in FIG. 3B, the plate electrode PL is advantageously a stacked layer structure, such as the PL (D) and PL (U), which can reduce the sheet resistance value of the plate electrode PL. As one example, when a high dielectric layer, such as BST and Ta2O5, is used for the capacitance insulating layer CP of the storage capacitor, the capacitance of the storage capacitor CS can be increased by using Ru for the bottom electrode (storage-node) SN and the upper electrode lower layer PL (D). Since Ru has a lower sheet resistance value than that of poly-Si, which has been used conventionally, the resistant value of the plate electrode PL can be reduced.

When W is stacked as the plate electrode PL (U) in the structure, the resistance value of the plate electrode PL can be further reduced. Thus, when the resistant value of the plate electrode PL itself is reduced, the noises on the plate electrode PL can be cancelled faster and the plate electrode PL noises can be reduced. TiN can be used for the plate electrode PL (D), also. In such a case, the same result as that described above can be obtained.

The memory cell structure described above includes a connection point SNCT for connecting the storage node SN and a source/drain diffusion layer of the MOSFET, which is adjacent to the bit line BL, as shown in FIG. 3A. In other words, a signal path is provided for transmitting a change in potential of the bit line BL to the storage node when a parasite capacitance exists between the storage node of-the memory cell and the bit line BL in the vertical direction of the cross section. Thus, it is advantageous to connect the plate electrodes PL mutually by wiring using itself.

Figure 4A:
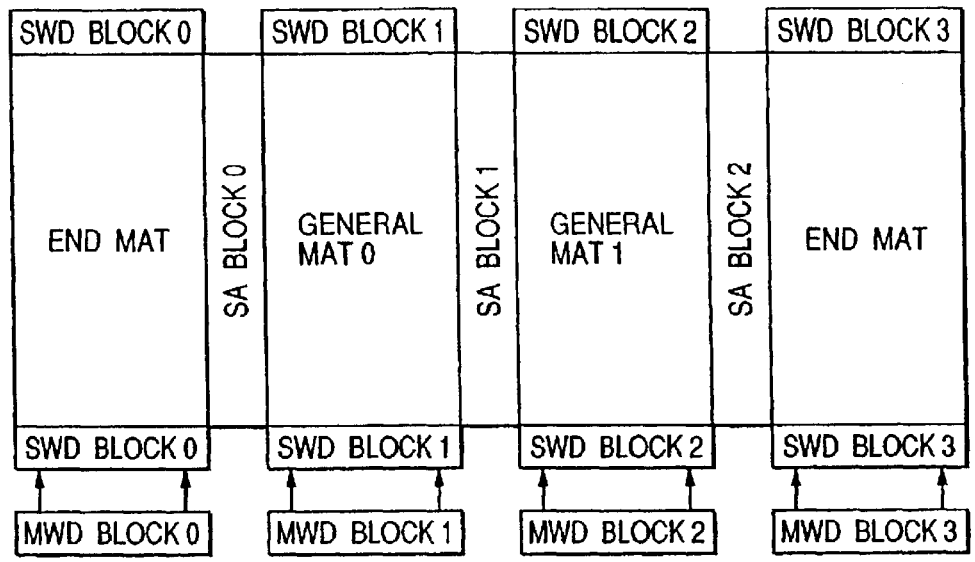
FIGS. 4A, 4B and 4C are diagrams schematically showing one embodiment of a word system control operation of the DRAM according to the present invention.
Figure 4B:
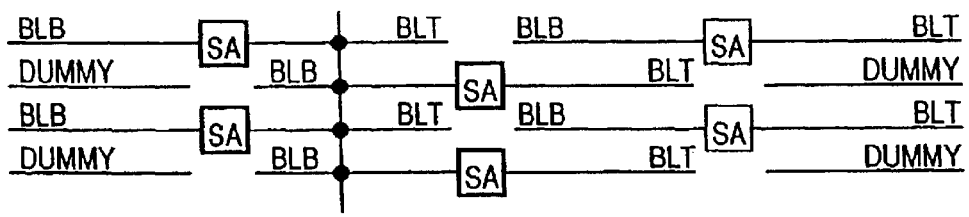
Figure 4C:
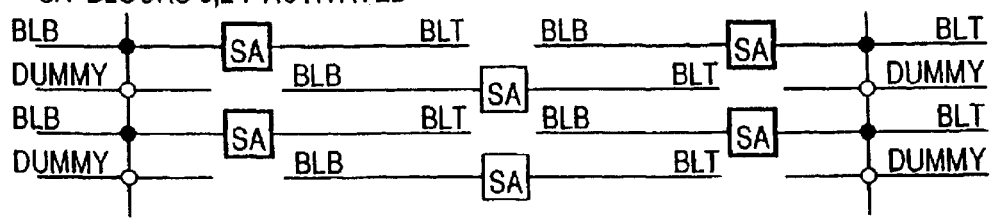

FIGS. 4A, 4B and 4C are diagrams for illustrating one embodiment of a control operation of the word system in the DRAM according to the present invention. For the structure of the memory mat, as shown in FIG. 4(A), four memory mats arranged in the bit line direction are represented for illustrative purposes. Memory mats on both sides in the bit line direction are called end memory mats (simply called an end mat hereinafter), while a memory mat sandwiched by sense amplifiers SA is called a general memory mat (simply called a general mat hereinafter). Since the sense amplifiers SA are connected to the bit line for every other memory mat, half of the bit lines are regarded as a dummy in the end mats. Thus, when word lines in the end mat are selected, the number of memory cells to be selected will be half of the number of word lines in the general mat if selected.

A word line is selected by the sub-word driver SWD distributed at the top and the bottom of the memory mat. The sub-word driver SWD responds to a select signal for the main word lines formed in the main word driver MWD provided in common for memory mats aligned in the word line extending direction, not shown, and a sub-word line select signal to select one sub-word line (sometimes simply called a word line hereinafter) from the four sub-word lines allocated to one main word line.

In this embodiment, the sense amplifiers are distributed on both sides of the bit line in the memory mat. When a plurality of memory mats are provided in the bit line direction, a pair of end mats is provided at both end portions. Thus, in order to use end mats only half of whose memory cell can be selected irregularly, as described above, effectively as a data storage area equal to the general mat, word lines on both side end pats are concurrently selected.

As shown in FIGS. 4B and 4C for the illustrative purposes, when each of four bit lines exists on the general mats 0 and 1, two sense amplifiers SA provided in the sense amplifier block (SA block) 0 are connected to two bit lines BLB of the end mat and two bit lines BLT of general mat 0. Two sense amplifiers SA provided in the sense amplifier block 1 are connected to two bit lines BLB of the general mat 0 and two bit lines BLT of general mat 1. Then, two sense amplifiers SA provided in the sense amplifier block 2 are connected to two bit lines BLB of the general mat 1 and two bit lines BLT of an end mat. In the end mat, bit lines, which are not connected to the sense amplifier, are regarded as a dummy.

For example, when word lines of the general mat 0 are selected, the word lines can select four memory cells crossing four bit lines. Stored information in the four memory cells are amplified by the sense amplifiers of two sense amplifier blocks 0 and 1 provided across the general mat 0. Then, a rewriting (refresh) operation is performed where a memory charge being almost lost by a storage capacitor due to the word line selection operation is recovered to the original charge condition. In other words, the dynamic memory cell performs a destructive read-out operation by turning ON the address select MOSFET through the word line selection operation, connecting the storage capacitor to the bit lines, and causing a charge share with the bit line parasitic capacitance to cause in the bit lines changes in micro-voltage in accordance with the memory charge. Thus, the dynamic memory cell requires a rewriting operation for the memory cell selected during amplification by the sense amplifier connected to the bit line crossing word lines to be selected.

On the other hand, when word lines on the end mats are selected, only two memory cells can be selected because the word lines on the end mat are constituted by crossing two bit lines and two dummy wires. Therefore, when data is written in or read out by selecting the word lines of the end mat also, only half of the data can be input or output, which deteriorates its effectiveness as a memory. Accordingly, as shown in FIG. 4C, when the word lines of the end mat are selected, word lines of the end mats on both sides are always selected. Thus, the number of memory cells to be selected by one word line selection can be four, which is equal to the number when a general mat is selected. In this way, according to the easy configuration where two word lines are always selected concurrently for the end mats, data can be written and read out by the same bit line selection operation in the same manner as the general mat.

According to this configuration, the end mats can be used effectively as a part of the memory area. Thus, in the micronized memory cell, for example, a read-out margin of the sense amplifier can be allocated, and, further, the chip occupying area per bit can be smaller as compared with the case where bit lines in the enct mat are used only for forming a reference voltage for the reading-out operation by the sense amplifier in order to allocate a read-out margin for the sense amplifier.

Figure 5A:
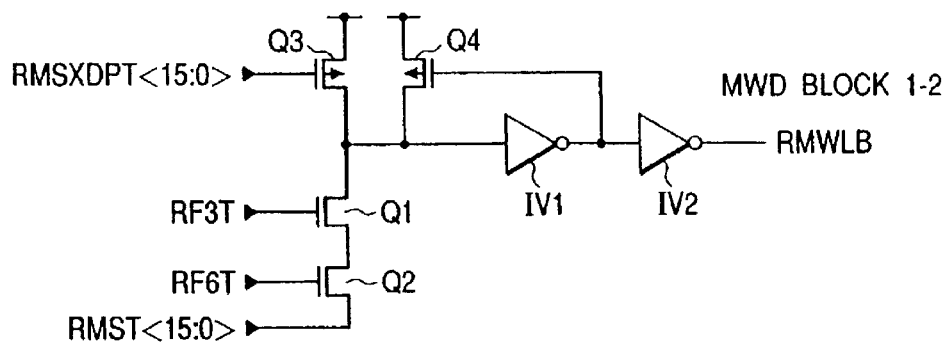
FIGS. 5A and 5B are schematic circuit diagrams showing one embodiment of a main word driver, MWD, of the DRAM according to the present invention.
Figure 5B:
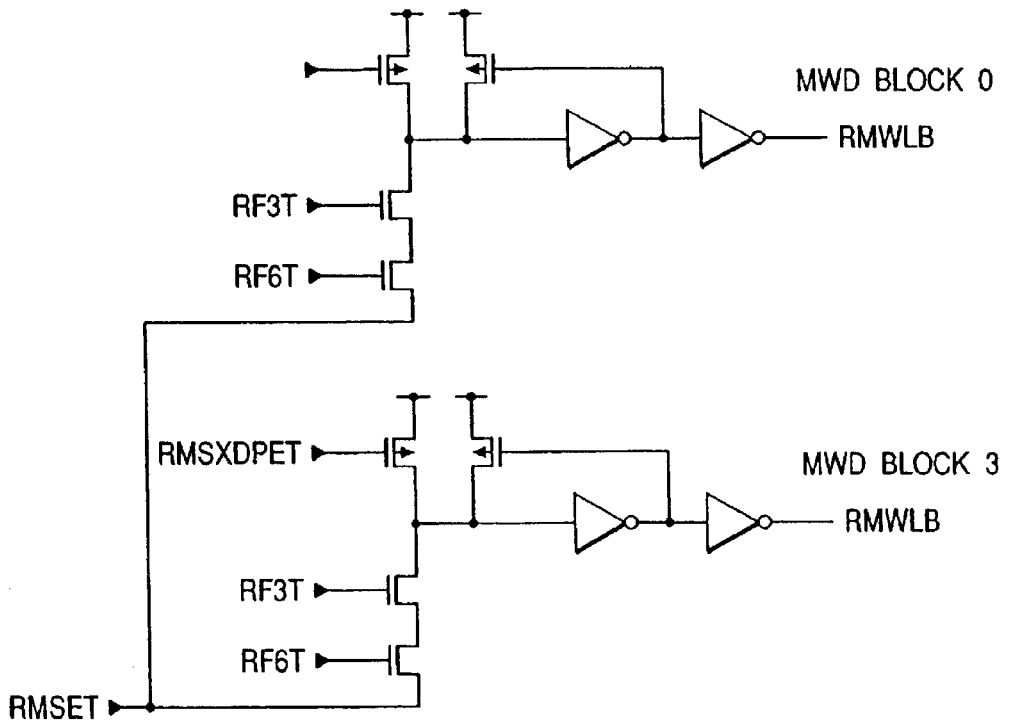

FIGS. 5A and 5B are circuit diagrams of one embodiment of the main word driver MWD of the DRAM according to the present invention. FIG. 5A shows a main word driver in the general mat, while FIG. 5B is a main word driver corresponding to two end mats. In FIG. 5A, a signal RMST<15:0> is a mat select signal when 32 memory mats are divided into 16 in sets of two as shown in FIG. 1. Signals RF3T and RF6T are predecode signals. In the general mat, pre-charge MOSFET Q3 in the selected mat is turned off by the pre-charge signal RMSXDPT<15:0>. At the low level of the signal RMST<15:0>, in one memory mat array (four memory mats in the example shown in FIG. 1), through MOSFETs Q1 and Q2 turned ON by the predecode signals .RF3T and RF6T, the pre-charge voltage of an input terminal of an inverter circuit IV1 is discharged. With the low level of the input terminal, the select signal RMWLB of the main word line becomes low level of the select level.

Unselected word lines in the selected mat maintains a pre-charge voltage corresponding to the unselected level since the low level corresponding to the pre-charge voltage of the input signal of the inverter circuit IV1 turns on a P channel type feedback MOSFET Q4 provided between the input terminal and operational power supply terminal. In the unselected memory mat, the pre-charge signal RMSXDPT<15:0> remains at the unselected level of the low level, which maintains the pre-charge operation.

In FIG. SB, a signal RMSET is a select signal for the end mat, and signals RF3T and RF6T are predecode signals. In the end mats, a pre-charge MOSFET in the end mat is turned off by the pre-charge signal RMSXDPET corresponding thereto. At the low level of the signal RMSET, in a two-end-mats array (four memory mats in the example shown in FIG. 1), through MOSFET turned ON by the predecode signals RF3T and RF6T, the pre-charge voltage of an input terminal of each inverter circuit IV1 is discharged. With the low level of the input terminal, the select signal RMWLB of the main word line corresponding to the two end mats becomes low level of the select level.

Unselected word lines in the selected mat maintain a pre-charge voltage corresponding to the unselected level since the low level corresponding to the pre-charge voltage of the input signal of the inverter circuit turns on a P channel type feedback MOSFET provided between the input terminal and the operational power supply terminal, in the same manner as the case of the general mat. When the word line of the general mat is selected, the pre-charge signal RMSXDPET remains at the unselected level of the low level, which maintains the pre-charge operation in the end mat.

According to the hierarchical word line method, the sub-word line (word line) on the lower layer is selected by the selection operation of the main word line. Thus, the main word driver of the end mat can be caused to perform word line selection for the end mat by means of each circuit change, which may generate a concurrent selection condition.

FIGS. 6A, 6B and 6C are diagrams of another embodiment of a control operation for the word system of the DRAM according to the present invention. The memory mat configuration, as shown in FIG. 6A, represents seven memory mats arranged in the bit line direction for illustrative purposes. Memory mats on both ends in the bit line direction are regarded as end mats. Among the general mats which are sandwiched by sense amplifiers SA, one placed at the center is called a center mat and is handled essentially as an end mat. This configuration is suitable for a case where two general mats are selected concurrently. In other words, it is suitable for the case where 32 memory mats are divided into two sets of 16 as shown in FIG. 1 in order to address the word system selection control when two memory mats are selected concurrently.

When word lines of the general mats 0 and 2 are selected concurrently as shown in FIG. 6B so as to increase the read/write bit numbers, two word lines of the end mats and a word line of the center mat are combined as shown in FIG. 6C. In other words, a memory cell connected to the sense amplifier (sense amplifier block) 2 on the left side of the center mat is combined with a memory cell connected to the left side end mat and a bit line. A memory cell of a bit line connected to a sense amplifier (sense amplifier block) 3 on the right side of the center mat is combined with a memory cell connected to the right side end mat and the bit line.

For example, when two sets of mat configurations shown in FIG. 4A are provided, the read/write bit numbers can be increased in the same manner as indicated above. However, the arrangement would have four end mats and then four word lines to be activated, which increases the current consumed by the word line selection. Further, in the end mat, the number of dummy bits is increased, which increases the occupied area per bit. In the configuration where a center mat is placed as indicated above and half of the bit lines are combined with the bit lines of end mats on both sides, the generation of the number of the dummy bit can be minimized, which reduces the occupied area and the select circuit for the bit lines can be common.

In this case, the center mat it is not necessary to locate at the center of the memory mat array. In FIG. 6A, a general mat 0 adjacent to the left side end mat can be used as the center mat. However, in such a case, the distances between the center mat (general mat 0) and the left end mat and the right end mat differ significantly. Thus, a transmission path for writing-in or reading-out signals is ruled by a slower one, which slows the operational speed substantially. Therefore, as in the embodiment shown in FIG. 6A, a general mat physically provided at the center of an array including a plurality of memory mats is preferably used as the center mat.

Figure 7:
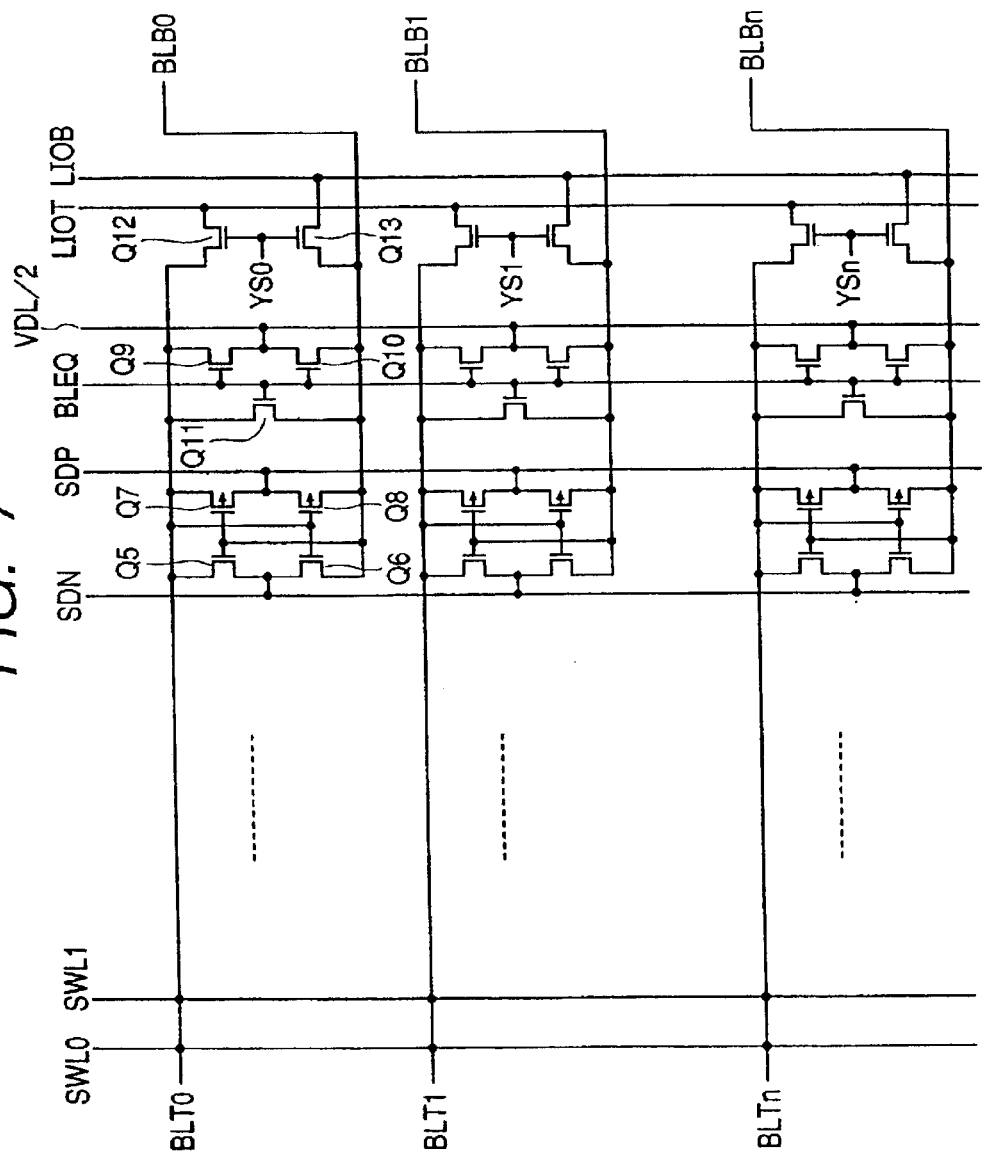
FIG. 7 is a schematic circuit diagram showing one embodiment of a sense amplifier portion of the DRAM according to the present invention.

FIG. 7 is a circuit diagram of one embodiment of a sense amplifier portion of a dynamic RAM according to the present invention. The sense amplifier SA is constituted by a CMOS latch circuit including N-channel type amplified MOSFETs QS and Q6 and P channel type amplified MOSFETs Q7 and Q8, which are in a latch form where a gate and a drain are cross-connected. The sources of the N-channel type MOSFETs QS and Q6 are connected to common source line SDN. The sources of P-channel type MOSFETs Q7 and Q8 are connected to a common source line SDP. Ground voltage VSS and operational voltage VDL of the circuit are supplied to the common source lines SDN and SDP through a power switch MOSFET, not shown. The power switch MOSFET may be, but not limited to, provided by being distributed in the sense amplifier portion.

A pre-charge (equalize) circuit including an equalize MOSFET Q11 for shorting the complementary bit lines BLTO and BLBO and switch MOSFETs Q9 and Q10 for supplying a half pre-charge voltage VDL/2 to the complementary bit lines BLTO and BLBO is provided in the input/output node of the sense amplifier SA. Commonly supplied to the gates of these MOSFETs Q9 to Q11 are pre-charge (bit line equalize) signals BLEQ. A driver circuit for forming the pre-charge signals BLEQ, not shown, includes an inverter circuit provided in the cross area 18 shown in FIG. 1 so as to make its starting-up faster. In other words, prior to the word line selection timing at the beginning of a memory access, the MOSFETs Q9 to Q11 forming the pre-charge circuit are caused to switch faster through the inverter circuit distributed in each of the cross areas 18.

A pair of input/output nodes of the sense amplifier SA are connected to the complementary bit lines BLT0 and BLB0 as well as to local (sub) input/out put lines LIOT and LIOB extended along the sense amplifier array via a column (Y) switch circuit including MOSFETs Q12 and Q13. The gates of the MOSFETs Q12 and Q13 are connected to the column select line YS, and they are turned ON when the column select line YS is at the select level (high level), which connects the input/output node of the sense amplifier SA to the local input/output lines LIOT and LIOB. Similar sense amplifiers, pre-charge circuits and column switch circuits are provided for other complementary bit lines BLT1, BLB1, BLT2, BLB2, also.

Thus, the input/output node of the sense amplifier SA amplifies a minute voltage change for the bit line half pre-charge voltage, which changes in accordance with a memory charge of a memory cell connected to a cross point with a word line of a selected memory mat between two memory mats (the MAT0 and MAT1, for example) provided across the input/output noie, by using a half pre-charge voltage of a bit line on an unselected memory mat side. The selection by the column select line YS is transmitted to the local input/output lines LIOT and LIOB through the column switch circuits (Q12 and Q13).

As shown in FIG. 1, the local input/output lines LIOT and LIOB are extended over a sense amplifier array aligned in the main word line extending direction. Further, a sub-amplifier circuit is provided in the local input/output lines as necessary to transmit amplifier signals. Then, as will be described later, it is connected to a main input/output line MIO aligned in the bit line direction and guided to a data output circuit or a data input circuit.

Figures 8A, 8B:
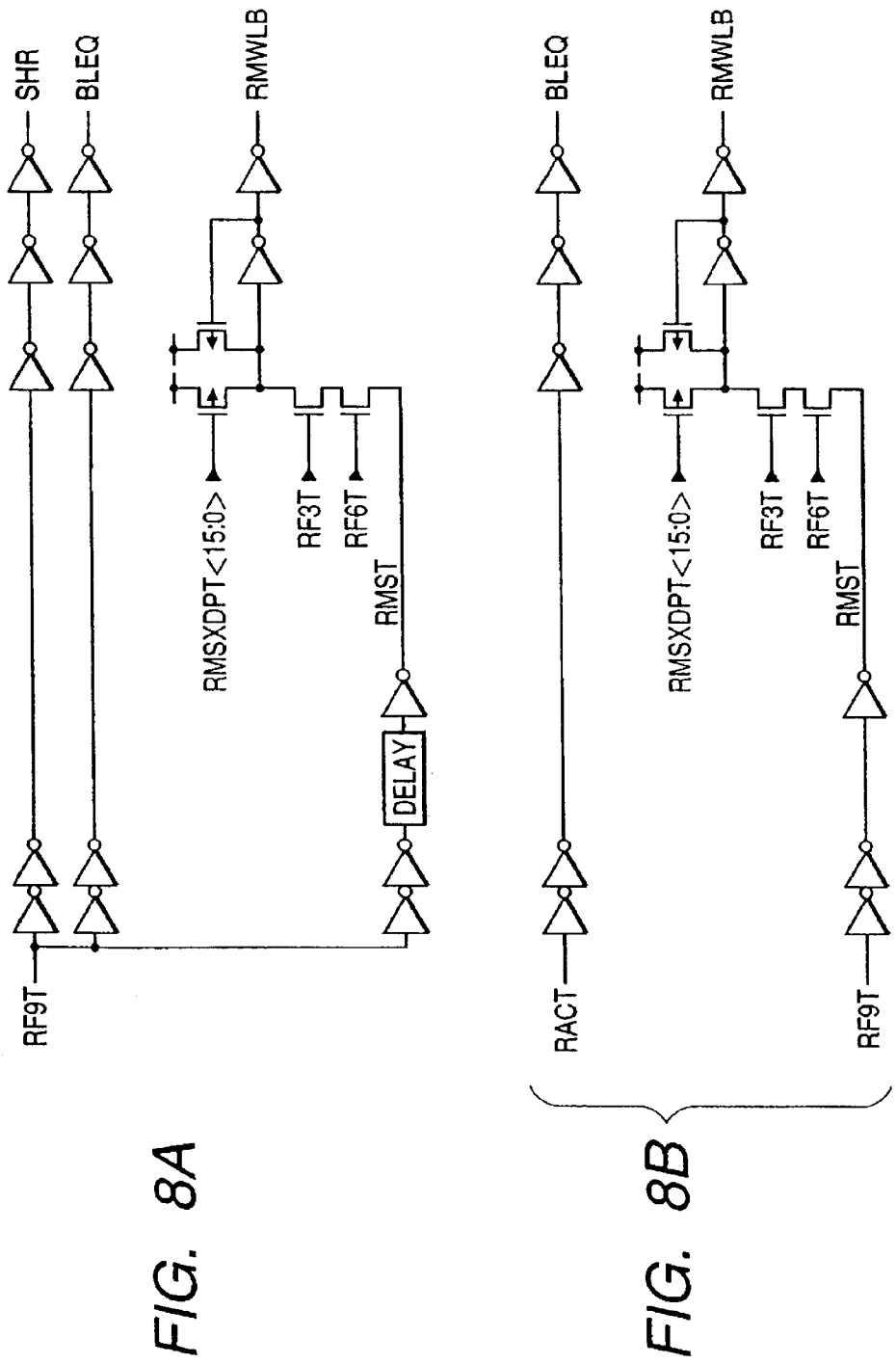
FIGS. 8A and 8B are schematic circuit diagrams showing one embodiment of a row system selector circuit of the DRAM according to the present invention.

FIGS. 8A and 8B are circuit diagrams of one embodiment of a row system selector circuit for the DRAM according to the present invention. This embodiment describes a partial circuit of the row system selector circuit where one of the end mats or general memory mats are used as a redundant circuit. FIG. 8A shows as a reference example a row system selector circuit in accordance with a folded bit line method and shared sense amplifier method. FIG. 8B shows a circuit diagram of a pre-charge control signal generator circuit and main word driven in accordance with the redundancy memory mats.

According to the shared sense amplifier method, when one of memory mats provided on both sides of the sense amplifier is used, a mat select signal RF9T, after a relief determination that a failed word line or bit line exists on the normal memory mat side, generates a shared switch control signal SHR and a pre-charge signal BLEQ corresponding to the redundant memory mat. Then, the switch control for the shared switch MOSFET and termination of the pre-charge circuit are matched in time by a delay circuit (delay), and a main-word line-corresponding to the redundant memory mat is selected.

On the other hand, when the end mat or the center mat of this embodiment is used as a redundant circuit, a timing signal RACT of a general mat corresponding to a regular circuit generates a pre-charge control signal concurrently with the regular circuit. Then, the main word line for the redundant mat uses the mat select signal RF9T of the relief determined redundant mat to select the main word line of the redundant mat. In this configuration, since the pre-charge operation needed for causing the main word line to be available for selection has already been carried out in advance, the main word line can be selected without inserting a delay circuit (delay), as described above.

According to the configuration, when there is no failure in the regular circuit, the word line of the redundant mat is not selected. Thus, there is no problem if the pre-charge operation is terminated. Since the pre-charge circuit performs the pre-charge operation in response to the termination of the reaular circuit operation, any problem will occur in the selection operation of the redundant circuit in the next memory cycle even when the pre-charge voltage of the bit line is reduced in some degree due to a leakage current, for example.

Figure 9A:
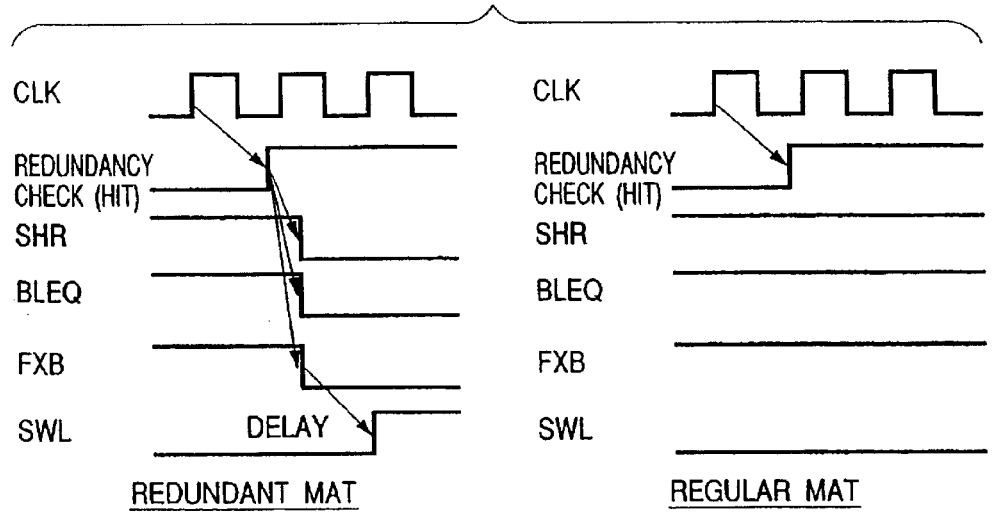
FIGS. 9A and 9B are waveform diagrams showing operations of the row system selector circuit of FIGS. 8A and 8B.
Figure 9B:
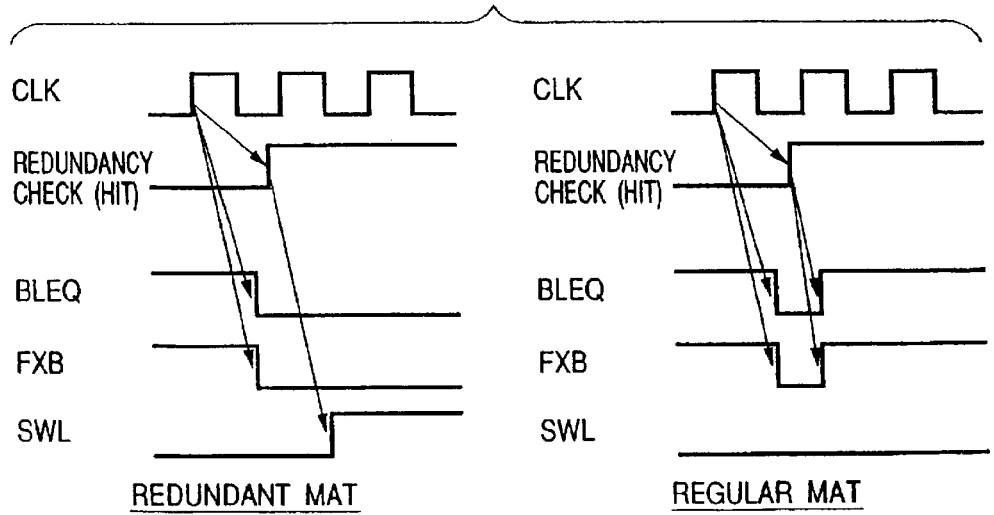

FIGS. 9A and 9B show waveform diagrams for illustrating operations of the row system selector circuit shown in FIGS. 8A and 8B. FIG. 9A corresponds to the circuit operation of the row system selector circuit in the FIG. 8A as a reference while FIG. 9B corresponds to the circuit operation of the now system selector circuit in FIG. 8B according to the present invention.

As shown in FIG. 9A, in the configuration where the shared switch select signal SHR and the pre-charge signal BLEQ are turned to the low level after the redundancy determination (hit) of the redundant mat, the timing for selecting the word line SWL has to be delayed by providing a delay circuit as described above in order to allocate a time needed for those operations. Here, in the regular mat, the signals SHR, BLEQ and FXB remain at the high level and the sub-word line SWL is also in the unselected state since the mat itself is unselected based on the redundancy determination (hit).

On the other hand, according to the present invention, as shown in FIG. 9B, the pre-charge signal BLEQ and the sub-word select line FXB of the redundant mat are tuned to the low level in response to a clock signal CLK without waiting for the redundant determination (hit) of the redundant mat. Then, the redundancy determination (hit) turns the sub-word line SWL to the select state. The sub-word select line FXB will be described later. In the regular mat, the pre-charge signal BLEQ and the sub-word select line FXB are turned to the low level in response to the clock signal CLK. Then, the redundancy determination (hit) returns.the pre-charge BLEQ and the sub-word select line FXB to the high level.

FIG. 10 is a block diagram of one embodiment of an I/O (input/output line) circuit of DRAM according to the present invention. In this embodiment, memory mats include end mats and two general mats in the same manner as FIG. 4. Local input/output lines LIO<0>, LIO<L> and LIO<2> are provided to the sense amplifier blocks (SA blocks) 0, 1 and 2, respectively, formed by being sandwiched between each of memory mats.

On the other hand, main input/output lines MIO<O> and MIO<L> are provided in the memory mat array direction, that is, in the bit line extending direction. Thus, when data is exchanged in 2 bits in the memory mat configuration, the local input/output lines LIO<0> and LIO<L> are associated with the main input/output lines MIO<0> and MIO<1>, respectively. Then, when a word line of the general mat 1 as described in note (a) is selected, the remaining local input/output line LIO<2> has to be associated with the main input/output line MIO<0> so as to avoid a data collision, since the local input/output line LIO<L> is associated with the main input/output line MIO<1>.

However, in the end mat as described above, in a case where two word lines are selected concurrently, the local input/output line LIO<2> corresponding to the right side end mat has to be associated with the main input/output line MIO<1> so as to avoid a data collision since the local input/output line LIO<0> corresponding to the left side end mat is associated with the main input/output line MIO<O>, which is opposite to the case where the word line of the general mat 1 is selected.

Accordingly, in this embodiment, a selector switch is provided between the main input/output lines MIO<0> and MIO<1> for the local input/output line LIO<2> provided in the sense amplifier block 2 provided between one end mat and a general mat as described above. Thus, the signal transmission path is switched over in order to achieve the association as described above in accessing the general mat and in accessing an end mat.

Figure 11A:
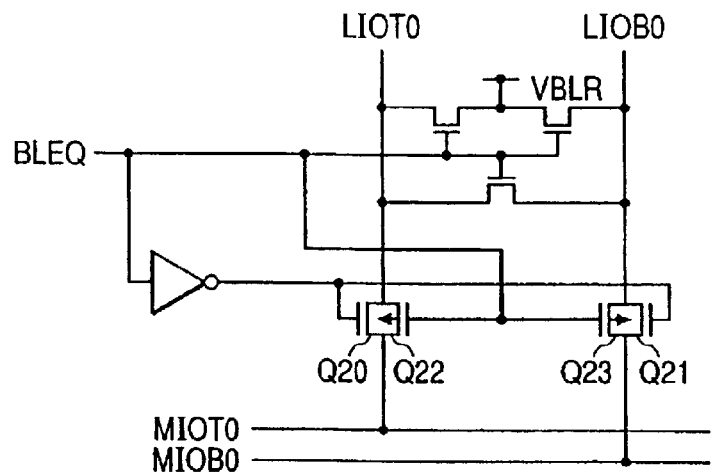
FIGS. 11A and 11B are schematic circuit diagrams showing one embodiment of an I/O circuit of the DRAM according to the present invention.
Figure 11B:
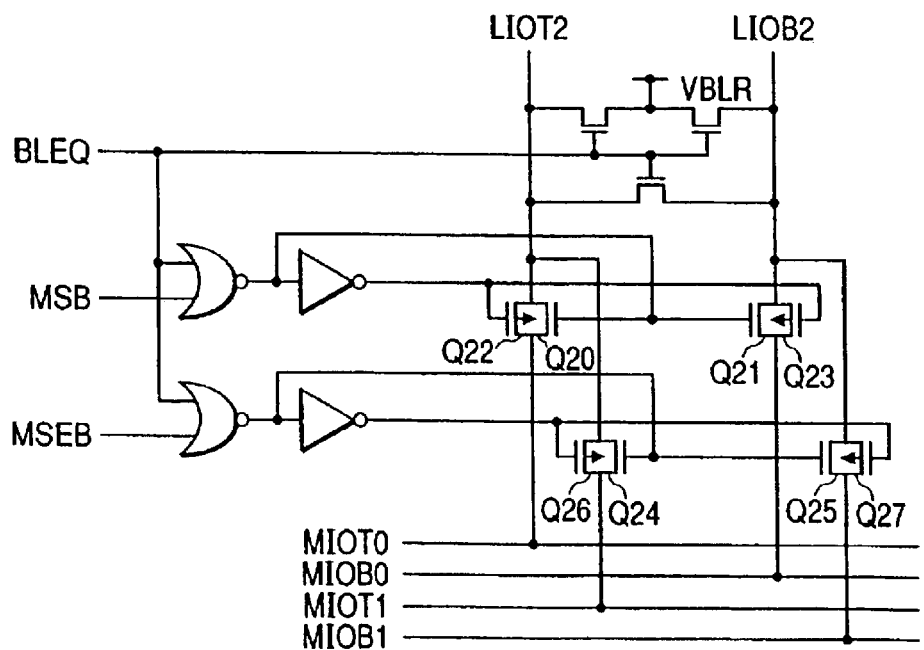

FIGS. 11A and 11B show circuit diagrams of one embodiment of an input/output circuit (I/O circuit) of the DRAM according to the present invention. FIGS. 11A and 11B are the circuit diagrams of the LIO-MIO switching circuit in the embodiment shown in FIG. 10. In this embodiment, a CMOS bus gate type switch is shown. Similar results can be obtained in case of connection by the sub-amplifier, for example.

In the same manner as the line LIO<0> in FIG. 10, the local input/output line LIO and the main input/output line MIO are connected selectively in one-to-one relationship. When the memory mat is unselected, a pre-charge signal BLEQ corresponding thereto is turned to the high level. Then, the complementary local input/output lines LIOT0 and LIOB0 are maintained in the pre-charge voltage VBLR state by an equalize MOSFET and a pre-charge MOSFET in order to turn off the CMOS switch MOSFETs Q20 to Q23.

When the memory mat is selected, the pre-charge signal BLEQ corresponding thereto is turned to the low level, which turns off the equalize MOSFET and the pre-charge MOSFET of the complementary local input/output lines LIOT0 and LIOB0. Then, CMOS switch MOSFETs Q20 to Q23 are turned on, which connects the local input/output lines LIOT0 and LIOB0 to the main input/output lines MIOT0 and MIOB0. In this configuration, the same operation is performed in the switch circuit between the local input/output line LIO<1> and the main input/output line MIO<1>.

In order to switch over between the main input/output lines MIO<0> and MIO<1> depending on the mat selection state in the same manner as the line LIO<2> in4 FIG. 10, MOSFETs Q20 to Q23 and Q 24 to Q27, for forming CMOS switch circuits, are provided, respectively. Then, when a general mat is selected, the signal MSB is turned to the low level, which turns on the switch MOSFETs Q20 to Q23 and connects the complementary input/output lines LIOT2 and LIOB2 to the main input/output lines MIOT0 and MIOB0, as described above. When an end mat is selected, the signal MSEB is turned to the low level, which turns on the switch MOSFETs Q24 to Q 27 and connects the complementary input/output lines LIOT2 and LIOB2 to the main input/output lines MIOT1 and MIOB2, as described above.

In this case, a switch is provided between the local input/output line LIO and the main input/output line MIO. A plurality of local input/output lines LIO are allocated to the main input/output line MIO, and only a selected one is connected to the main input/output line MIO. That is it has been described for the case where it is applied to hierarchical input/output lines. However, the same selector switch is provided for the local input/output line corresponding to one end mat as described above even when the local input/output line LIO and the main input/output line MIO are directly connected.

FIG. 12 is a block diagram of another embodiment of an input/output line (I/O) circuit of the DRAM according to the present invention. In this embodiment, in the same manner as FIG. 6A, memory mats include two end mats, a center mat and general mats. Sense amplifier blocks (SA blocks) 0 through 5 formed by being sandwiched between each of the memory mats are provided with local input/output lines LIO<0> to LIO<5>, respectively.

On the other hand, main input/output lines MIO<0> to MIO<3> are provided in the memory mat array direction, that is, in the bit line extending direction. Thus, when memory mats are divided into two sets and data is exchanged in 2 bits from each set, that is four 4 bits as a whole in the memory mat configuration, the local input/output lines LIO<1> and LIO<2> are associated with the main input/output lines MIO<1> and MIO<0>, respectively, in one set, while in the other set, the local input/output lines LIO<3> and LIO<4> are associated with the main input/output lines MIO<2> and MIO<4>, respectively.

In this case, when a word line of the general mats 0 and 3 is selected as shown in FIG. 11(A), local input/output lines LIO<0> and LIO<5> have to be associated with the main input/output lines MIO<0> and MIO<2>, respectively, so as to avoid data collision, since the local input/output lines LIO<1> and LIO<4> are associated with the main input/output lines MIO<1> and MIO<3>, respectively.

On the other hand, when word lines of two end mats and a center mat are selected as shown in FIG. 11(B), local input/output lines LIO<0> and LIO<5> have to be associated with the main input/output lines MIO<1> and MIO<3>, respectively, so as to avoid data collision, since the local input/output lines LIO<2> and LIO<3> are associated with the main input/output lines MIO<0> and MIO<2>, respectively.

Accordingly, in this embodiment, a selector switch is provided between the main input/output lines MIO<0> and MIO<1> and MIO<2> and MIO<3> for the local input/output lines LIO<0> and LIO<5> provided in the sense amplifier blocks 0 and 5 provided between one end mat and a general mat as described above. Thus, the signal transmission path is switched over in order to achieve the association as described above in accessing the general mat and in accessing an end mat.

Figure 13A:
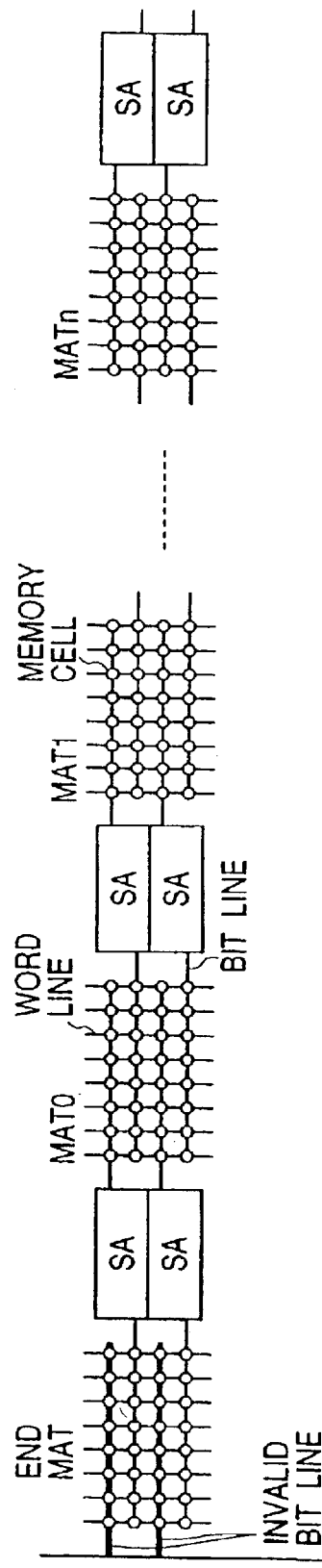
FIGS. 13A and 13B are schematic diagrams showing one embodiment of a bit line configuration on end mats in the DRAM according to the present invention.
Figure 13B:
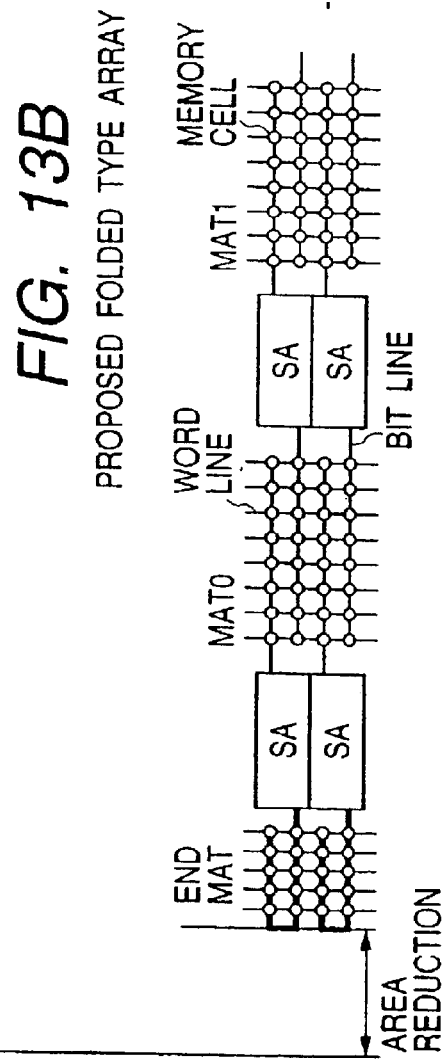

FIGS. 13A and 13B are schematic diagrams of one embodiment of a bit line configuration in an end mat of the DRAM according to the present invention. FIG. 13A is a diagram illustrating the array configuration where a sense amplifier is arranged alternatively at one simple cross point. In the end mat, an invalid bit line exists as it is without connection to the sense amplifier SA. The same end mat is provided on the other side of the sense amplifier SA corresponding to a memory mat MATn, but it is omitted here. Since an invalid bit line (dummy bit line) as described above exists, the number of valid memory cells provided in the end mat would be half of those in the general mat. Thus, word lines in the end mats on both sides are selected concurrently. That is, the combination of two end mats produces a memory access equivalent to that with one general mat.

FIG. 13B shows a folded bit line in the end mat. In other words, a wiring area for the invalid bit line is utilized for the location of the folded bit line of the end mat. Folding the bit line reduces the length of the end mat in the bit line direction to the half of the length of the general mat in the bit line irection, which achieves an area reduction of the end mat. This area reduction is achieved in the other emory mat, resulting in an area reduction equal to one general mat.

When a plurality (N) of memory mats exist in the word line direction, areas equal to N general mats can be reduced as a whole. It should be noted that in the dynamic RAM as described for the embodiment in FIG. 1, there are four memory arrays as a whole and an area equal to four general mats can be reduced in each memory array. Thus, area reduction equal to 16 general mats can be attempted in the whole chip.

Figure 14A:
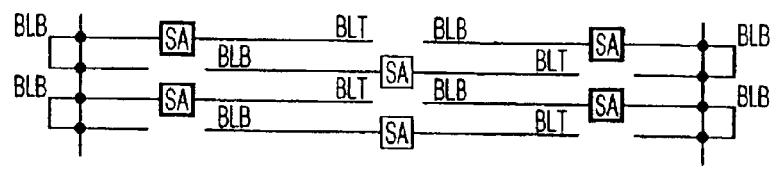
FIG. 14A is an equivalent diagram of FIG. 13B, and FIGS. 14B and 14C are waveform diagrams showing a read-out and select operation of a folded type end mat of FIG. 14A.
Figure 14B:
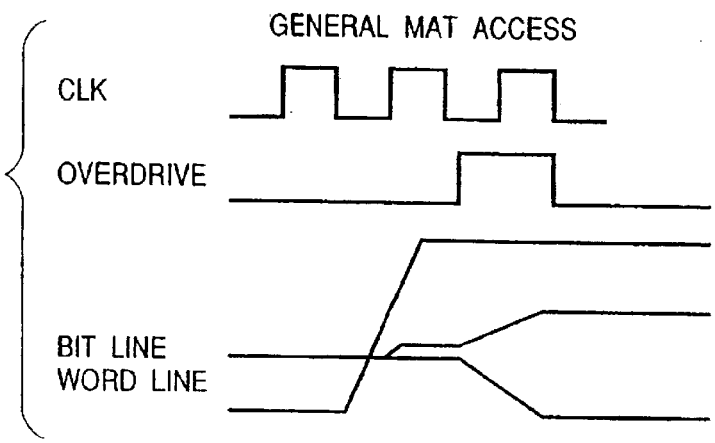
Figure 14C:
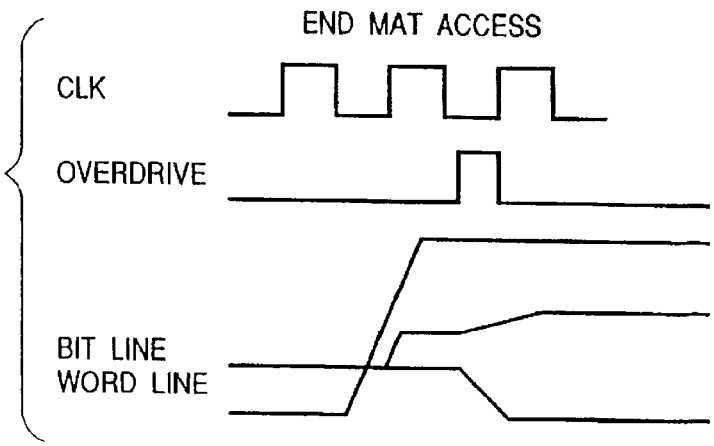

FIGS. 14B and 14C are waveform diagrams for a reading out selection operation for the folded type end mat. When the bit line is folded for area reduction of the end mat, as shown in FIG. 14A, read-out charges from two memory cells are transmitted to the bit line by the word line selection operation. In other words, the read-out signal amount of the bit line of the end mat as shown in FIG. 14C is twice as much as the read-out amount of the bit line of the general mat as shown in FIG. 14B.

Accordingly, the overdrive period of a sense amplifier for amplifying readout signals of the bit line of the end mat is made shorter than the overdrive period defined in the sense amplifier when the micro-signals of the bit line of the general mat are amplified. Alternatively, when the readout signals of the bit line of the end mat are amplified, the overdrive of the sense amplifier is omitted. This timing adjustment allows readout operations which are almost equivalent between those with the end mat and the general mat.

Figure 15:
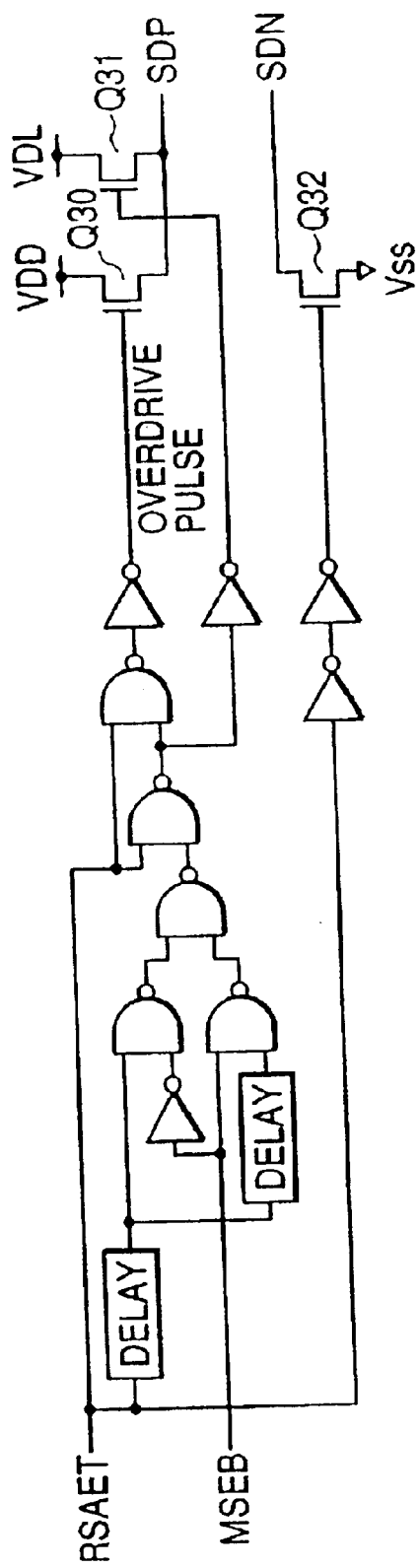
FIG. 15 is a schematic circuit diagram showing one embodiment of a sense amplifier control circuit in the DRAM according to the present invention.

FIG. 15 is a circuit diagram of one embodiment of the sense amplifier control circuit. When a word line of an end mat is selected, two sense amplifier arrays operate with a relatively large distance. Then, the convergence of current required for the amplifying operation by the sense amplifier is reduced in the wire for supplying an operational voltage. As a result, efficient current supply is achieved. In other words, since the voltage decrease gets smaller in the power supply line due to the increase in the operational current, the amplifying operation by the sense amp lifier can become faster by as much.

In addition, when a bit line is folded in the end mat as described above and two memory cells are selected by selecting one word line, the signal amount read out td the bit line as described above would be twice. Accordingly, two start-up signals are provided for reducing the sense amplifier over driver period when the end mat is selected. The signal RSAET is a sense amplifier start-up signal. When the end mat is unselected, the high level of the signal MSWEB generates overdrive pulses during the period equal to the delay time produced by the transmission of a delay signal through two delay circuits (delay) Then, this turns on the MOSFET Q30 so that the over drive pulses such as power supply voltage VDD are supplied to a common source line SDP of the P-channel type MOSFET of the sense amplifier.

On the other hand, when the end mat is selected, the signal MSEB is turned to the low level. This opens the gate for transmitting a delay output from one delay circuit. Thus, over drive pulses are generated during the period equal to the delay time, which turns on the MOSFET Q30. Thus, this can prevent the sense amplifier from being over driven excessively when the end mat is selected. After the delay time corresponding to the over drive has passed, the MOSFET Q30 is turned off and MOSFET Q31 is turned on so that the operational voltage inherent to the sense amplifier such as VDL is supplied. In the common source line SDN of the N-channel type MOSFETs, the high level state of the start-up signal RSAET turns on OSFET Q32 so that ground potential VSS of the circuit is transmitted.

In the DRAM of this embodiment, the power supply voltage VDD is a relatively high voltage such as 3.3 V or 2.5 V. It is stepped down by the VDL to a lower voltage such as 2.2 V or 1.8 V. When the sense amplifier starts its amplifying operation, a higher overdrive voltage such as VDD is used as the VDL so that the start-up to the VDL in the bit line gets faster in order to cause either one of the complementary bit lines BLT and BLB to be at the high level in accordance with the stored information in the memory cell. When the signal amount is larger as in the end mat and the overdrive period.is longer, a problem that the high level of the bit line exceeds VDL occurs. Thus, the timing adjustment as described above is necessary.

Figure 16A:
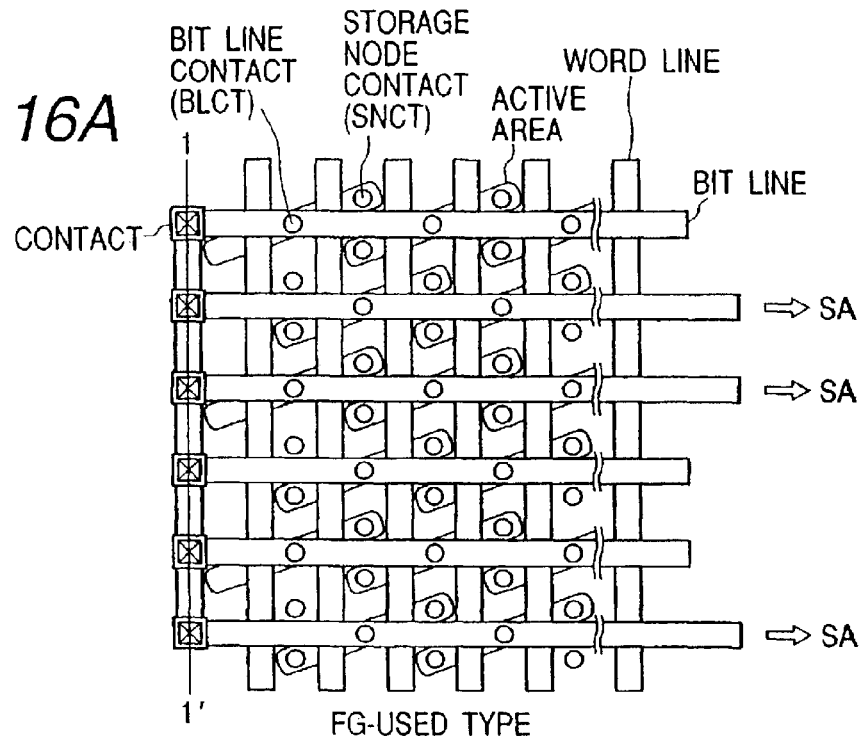
FIGS. 16A and 16B are diagrams showing one embodiment of the folded type end mat in the D according to the present invention.
Figure 16B:
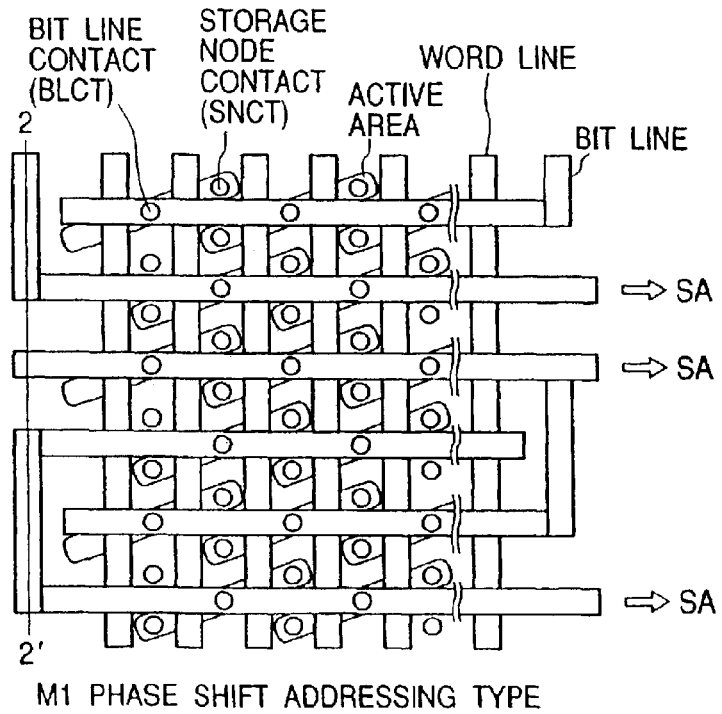

FIGS. 16A and 16B are schematic layout diagrams of one embodiment of the folded type end mat. In FIG. 16A, a bit line connected to one input/output node of a sense amplifier SA on one end is folded at the middle in its extending direction. In other words, a bit line and an invalid bit line adjacent thereto are connected and folded at the middle portion and the remaining half is omitted. In this embodiment, in consideration of the layout of the sense amplifiers, two neighboring two bit lines, but not limited thereto, are validated, and the invalid bit lines are positioned on both sides. The portion of the invalid bit lines is used to allow the upper bit line to be folded to the upper side and the lower bit line to be folded to the lower side. The repetition of this pattern constitutes the end mat.

Figure 17A:
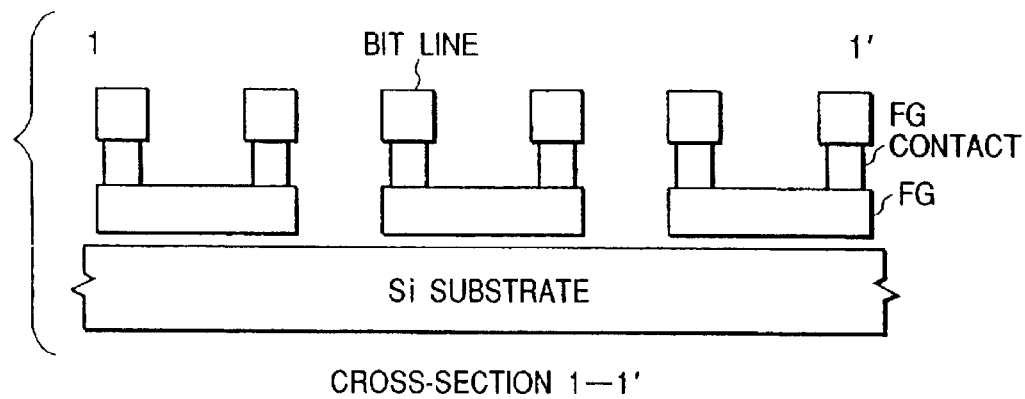
FIGS. 17A and 17B are cross section views showing one embodiment of the folded type end mat as seen along lines 1–1' and 2–2' of FIGS. 16A and 16B, respectively.

As shown in FIG. 17A, the connection of the folded part is achieved by using a first polysilicon layer FG constituting a gate electrode and a word line of the MOSFET in the folded portion and an FG contact, but the invention is not limited thereto. As shown in the cross section in 3, the bit lines are regarded as a first metal layer M1. The FG contact connects FG and M1. When the phase shift method, which is one of micromachining technologies, is used, the adjacent bit lines are formed in a different process. Thus, they have to be connected to each other by FG and a FG contact as described above.

In FIG. 16B, one end of a bit line connected to one input/output node of the sense amplifier SA is folded by using every other bit line at the middle portion in its extending direction. In other words, the bit line connected to one sense amplifier branches off at the connection portion with the sense amplifier so as to produce every other bit and extends up to a length equal to half of the general mat bit line. The bit line connected to the sense amplifier and the adjacent sense amplifier extends up to a length equal to the half of the general mat bit length without branching off from the connection portion. Then, it is folded and further extends toward the sense amplifier between the branched off bit line. In other words, the branched off bit line and the folded bit line are positioned alternately. The repetition of the pattern described above constitutes the end mat.

Figure 17B:
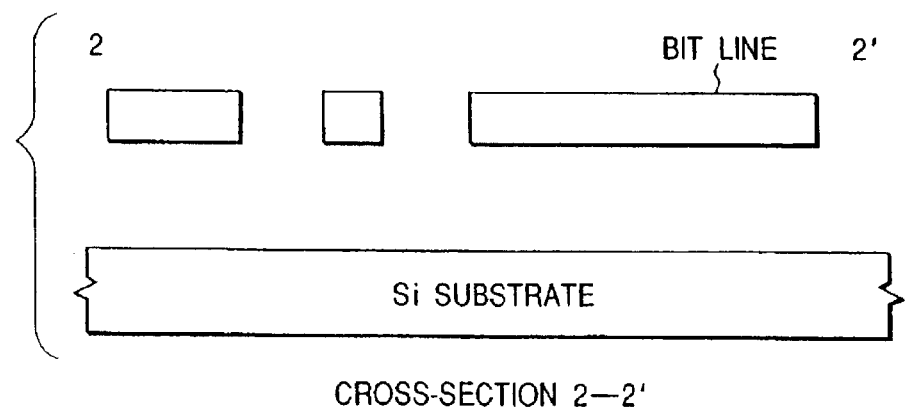

The connection of the folded portion is as shown in FIG. 17B, and the bit line is constituted by a first metal layer M1 as shown in the cross section in 3, but is not limited thereto. In other words, when the phase shift method, which is one of the micromachining technologies as described above, is used, every other one of the bit lines can be formed. Thus, the branched off bit line and the folded bit line can be formed integrally in respective processes.

Figure 18:
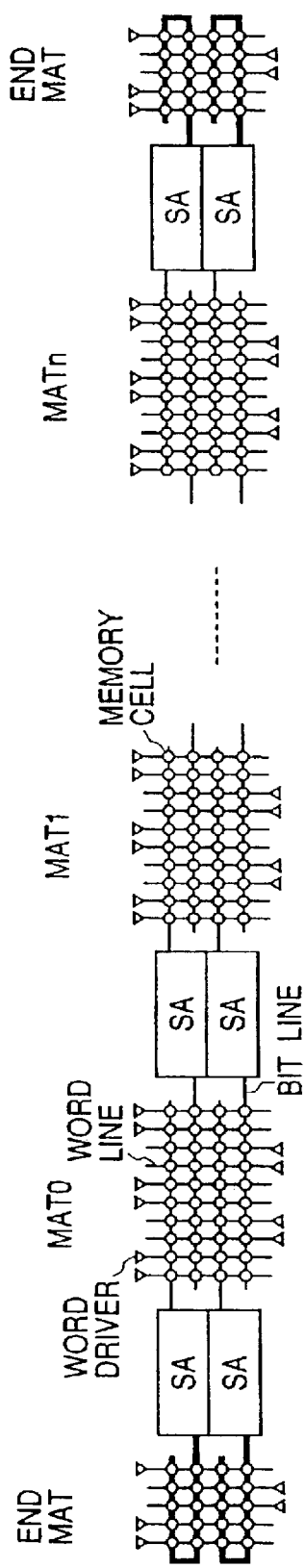
FIG. 18 is a schematic diagram showing another embodiment of a bit line configuration of the end mat in the DRAM according to the present invention.

FIG. 18 is a schematic diagram of another embodiment of the end mat bit line configuration in the DRAM according to the present nvention. In this embodiment, it is assumed that the end mat includes a folded bit line. Thus, two memory cells are connected in parallel at a cross point of a word line and a bit line. This end mat is, but not limited to, a redundant mat for relieving a failed word line in the general mat.

When the end mat is used as a redundant mat as described above, the number of memory cells to be connected to the word line is reduced to half. Thus, the word line is selected in both end mats in the same manner as indicated above. The configuration where the end mat is used as a redundant mat and two memory cells are positioned at a cross point of the word line and the bit line as described above not only reduces the area occupied by the end mat, but also it produces excellent effects including an increase in the relief efficiency.

Connecting two memory cells to the bit line in parallel can double the signal amount as described above. In other words, in the end mat, almost none of the memory cells cause a failure due to a short information holding time. Thus, this can significantly reduce the probability for causing a failure that the information holding time is short in the redundant mat when switched to the redundant mat, which results in a relief failure.

Figure 19:
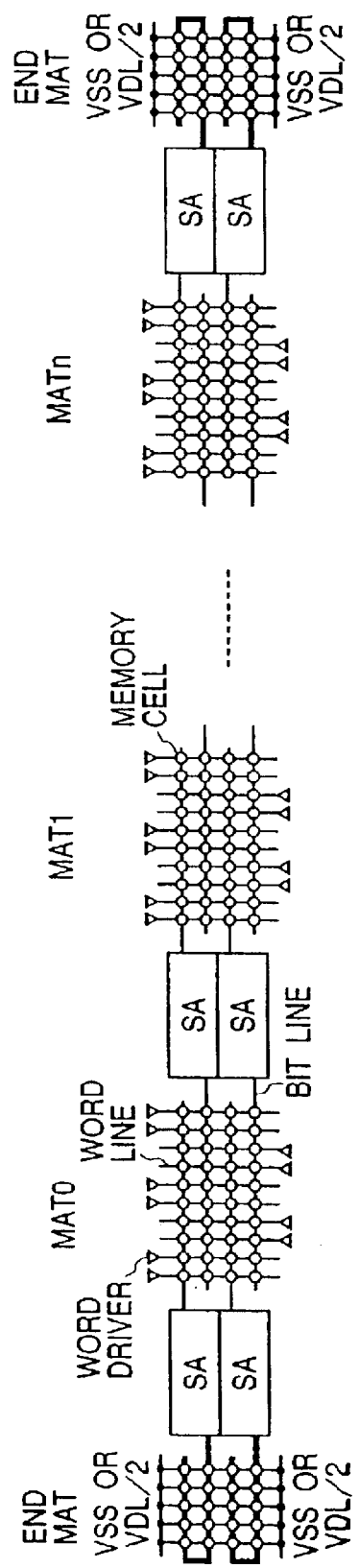
FIG. 19 is a schematic diagram showing another embodiment of the bit line configuration of the end mat in the DRAM according to the present invention.

FIG. 19 is a schematic diagram of another embodiment of the end mat bit line configuration in the DRAM according to the present invention. In this embodiment, the end mat includes a folded bit line, which is used for reference of the general mat. In this case, the word line is fixed to a circuit ground potential VSS or bit line half pre-charge voltage VDL/2. Fixing the potential of the word line can reduce noises caused in the end mat when reading out.

Figure 20:
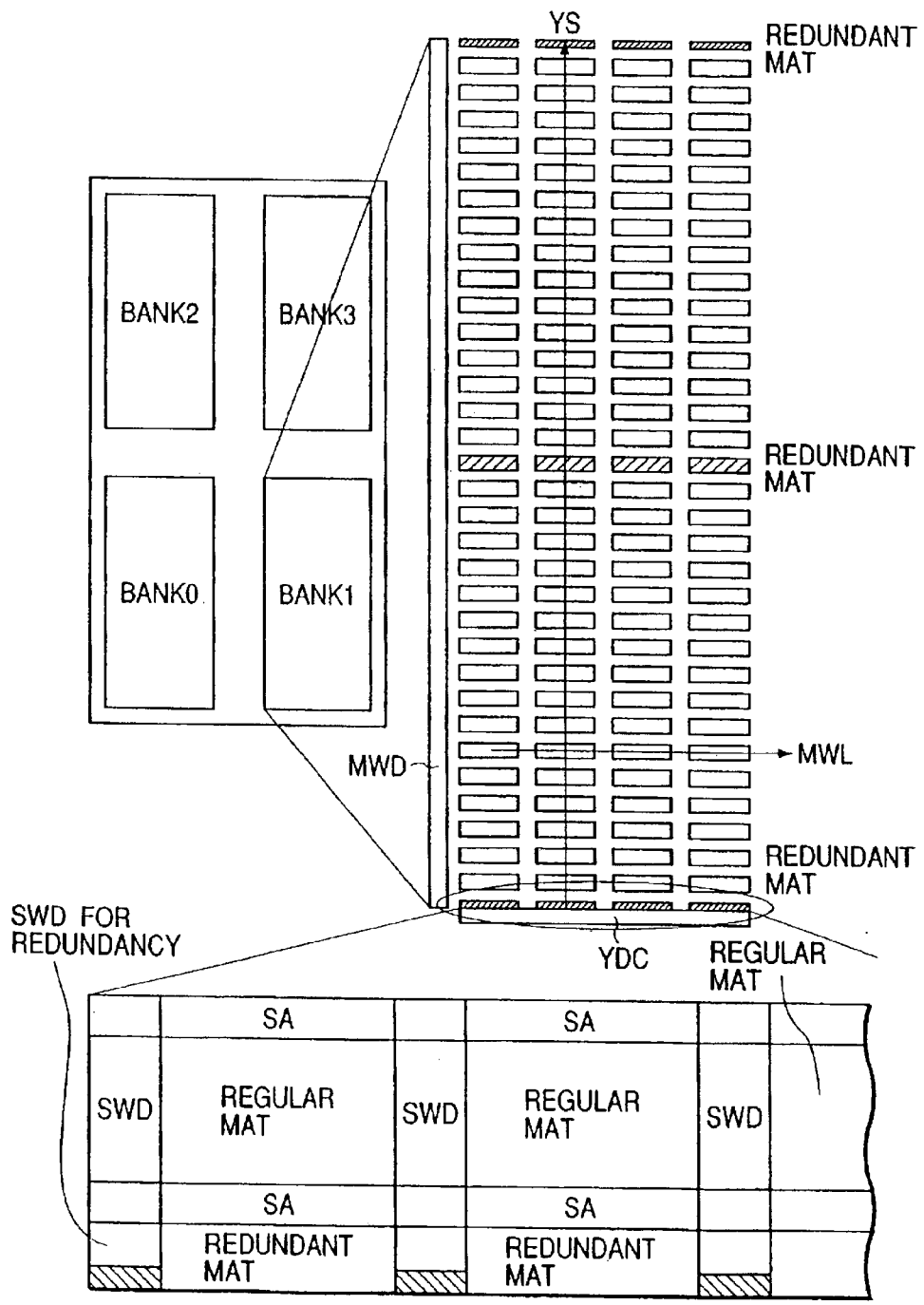
FIG. 20 is a schematic layout diagram showing one embodiment of the DRAM to which the present invention is applied.

FIG. 20 is a schematic layout diagram of one embodiment of a DRAM to which the present invention is applied. In this embodiment, a memory array is divided into four in the same manner as that in FIG. 1, and they form memory BANK0 to BANK3, respectively. As represented by one memory bank BANK1 for the illustrative purposes, 33 memory mats and two end mats are provided in the bit line direction (YS) and four memory mats are positioned in the word line direction (MWL).

Provided in the longitudinal center part of a semiconductor chip are an input/output interface circuit including a data input/output circuit and a bonding pad array and a power supply circuit including a step-up circuit and/or a step-down circuit. A main word driver MWD is positioned along the center part and drives a main word line MWL positioned such that it can reach each sub-word driver through the four memory mats. A column decoder area YDC is provided in the lateral end part of the semiconductor chip and drives a column select line YS, which extends therefrom through the 33 general mats and one end mat to the sense amplifier array corresponding to them.

In this embodiment, a center mat provided at the center of the 33 general mats arranged in the bit line direction and the end mat are used as redundancy mats MAT. In other words, the memory mats shown in FIG. 6A or 12 are divided into two sets in the center part and one word line is selected in general mats in each set. When a word line failure occurs in the general mat selected in either one of the sets, two word lines of the center mat and the end mat are selected for word line failure relief. When the bit line of the end mat is folded as described above so that two memory cells form a redundancy cell, two word lines may be selected at the same time in the center mat.

Figure 21:
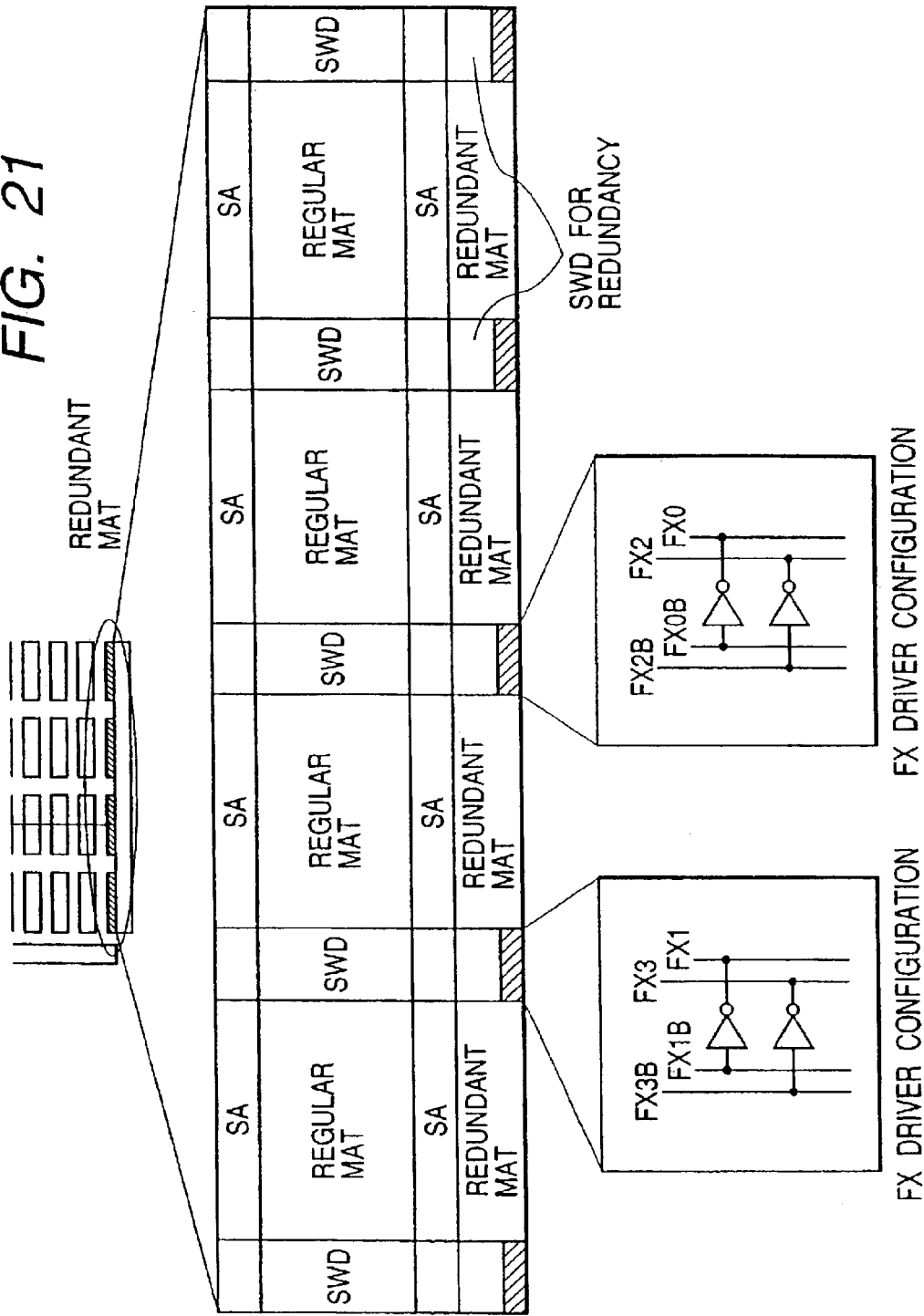
FIG. 21 is a magnified view of end mats and general mats adjacent thereto in a memory bank BANK 1 shown in FIG. 20.

FIG. 21 shows a magnified view of the end mats and general mats in the memory bank BANK1 shown in FIG. 20.

In this embodiment, the hierarchical word line method is adopted, and a word line provided in a emory mat is selected based on a combination of a main word line MWL and a sub-word select signal FX. The sub-word select signal FX is an operational voltage of the sub-word driver SWD, as will be described later, and its voltage level is a select signal of the sub-word line.

In the dypamic memory cell, information charges are supplied to a storage capacitor through an address select MOSFET. In order to communicate the high level of the bit line to the storage capacitor, the gate voltage of the MOSFET has to be equal to or higher than a threshold voltage of the MOSFET for the high level of the bit line. The effective threshold voltage of the address select MOSFET is raised by forming a gate insulating film so as to be thicker or by supplying a negative back-bias voltage to the substrate in order to reduce leakage current in the off state (sub-threshold leakage current).

Therefore, the select level of the sub-word line has to be the step-up voltage VPP, which is higher than the threshold voltage of the MOSFET with respect to the high level of the bit line (VDL or VDD). Thus, an FX driver is needed for communicating a sub-word line select, signal corresponding to the step-up voltage to each sub-word driver SWD. The FX driver corresponding to the sub-word driver SWD of the general mat may be provided in a cross area where a sense amplifier array SA and a sub-word driver array SWD intersect. On the other hand, when the cross area does not exist because the memory bank end terminates at a memory cell in the alternate sense amplifier positioning in the open bit configuration, the FX driver cannot be provided.

When the end mat is used only for reference, the word line may be at the fixed level as described above. Thus, the sub-word driver is not necessary and the problem described above is not caused. On the other hand, when it is used as a redundant mat as in this embodiment, the sub-word driver has to be operated for failed word line relief. In this embodiment, a part of the redundant array. SWD is used as an FX driver area in the end mat. In other words, when the end mat is used as a redundant mat, all of word lines formed therein do not have to be utilized. Thus, the end portion word line is used as a dummy word line and the sub-word driver area corresponding to it us used as the FX driver area.

In this embodiment, four sub-word lines WL0 to WL3 are provided with,one main word line MWL, and sub-word select lines FX0 to FX3, FX0B to FX3B are needed or selecting one of the four sub-word lines. In this mbodiment, sub-word lines provided in one memory mat are selected half and half by sub-word driver arrays SWDA provided on both sides of the memory mat. In other words, in the memory mat as shown in FIG. 2, sub-word drivers are distributed to both sides of the memory mat for every two word lines in order to achieve staggered positioning in the same manner as the sense amplifier. Therefore, when four sub-word line are selected with one main-word line as described above, the sub-word drivers for generating sub-word select signals for selecting one sub-word line among the four sub-word lines are provided for every other memory mat in two groups, one for sub-word select signals FX0 and FX2 and the other for sub-word select signals FX1 and FX3.

Figure 22:
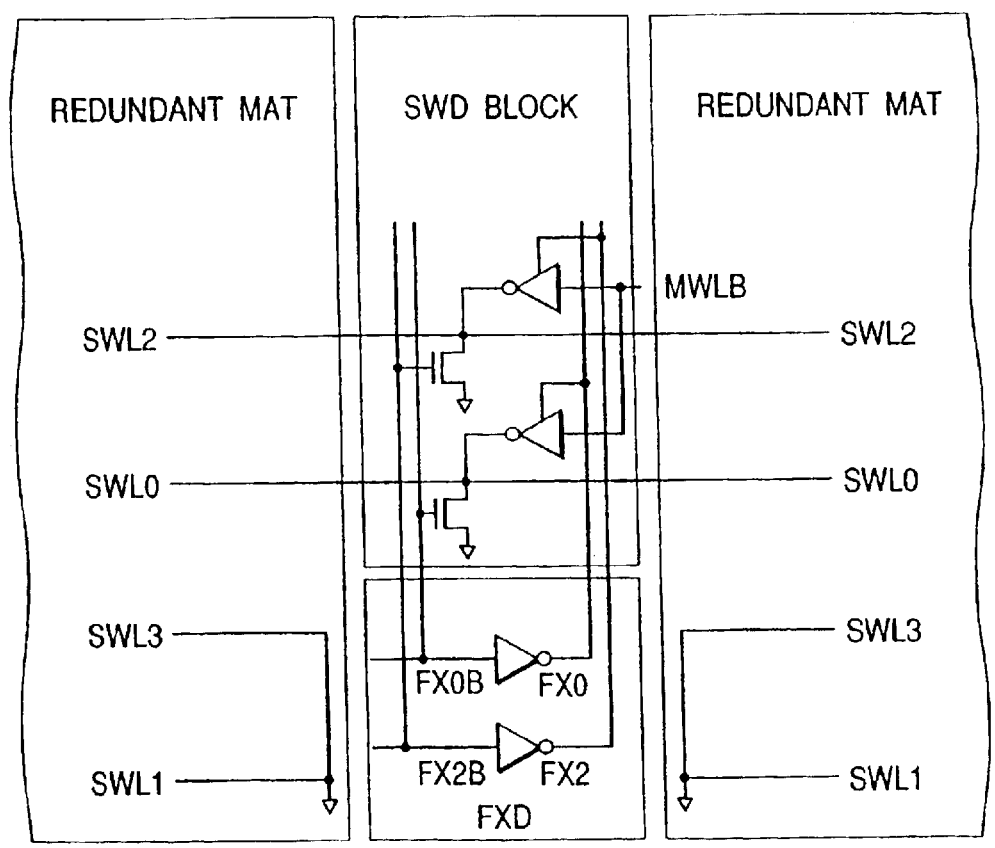
FIG. 22 is a schematic circuit diagram showing one embodiment of an FX driver and a sub-word driver according to the present invention.

FIG. 22 is a circuit diagram of one embodiment of an FX driver and a sub-word driver according to the present invention. The sub-word driver includes a CMOS inverter circuit and an N channel type MOSFET provided between an output of the CMOS inverter circuit and a ground potential of the circuit. Select signals MWLB from the main word line are commonly supplied to input terminals of two CMOS inverter circuits provided in the sub-word driver area. The main word select signals MWLB are commonly supplied to the CMOS inverter circuits provided in the sub-word driver region provided in the other end of a redundancy mat in FIG. 22 in order to select four sub-word lines.

The sub-word line select signals FX0 and FX2 formed in the FX drivers are supplied to power supply terminals of the two CMOS inverter circuits, that is, source terminals of a P channel type MOSFET included in the CMOS inverter circuits, respectively. The operational voltage of the FX drivers is used as a step-up voltage VPP, which is a select level of the sub-word line select signals FX0 and FX2. The input signals FX0B and FX2B supplied to the input terminals of the FX drivers are supplied to the gate of the N channel type MOSFET provided between the output of the sub-word driver and the ground potential of the circuit. The FX driver and its adjacent FX driver form the sub-word line select signals FX1 and FX3.

When the select signals MWLB of the main word line is at a low level, the P channel type MOSFET is turned ON and the N channel type MOSFET is turned OFF in the CMOS inverter circuit. Therefore, the sub-word line SWL0 or SWL2 is turned to the VPP level in the sub-word driver SWD in which the sub-word line select signal FX0 or FX2 are turned to the select level VPP by the FX driver. Here, sub-word line select signal FX0B or FX2B of the unselected one is turned to the high level, which then turns the switch MOSFET ON in order to fix the sub-word line SWL0 or SWL2 at the circuit ground potential. The sub-word line SWL corresponding to an area where the FX driver is provided is used as, but is not limited to, a dummy word line, which is also used as, but is not limited to, an unselect level, such as the circuit ground potential.

Figure 23:
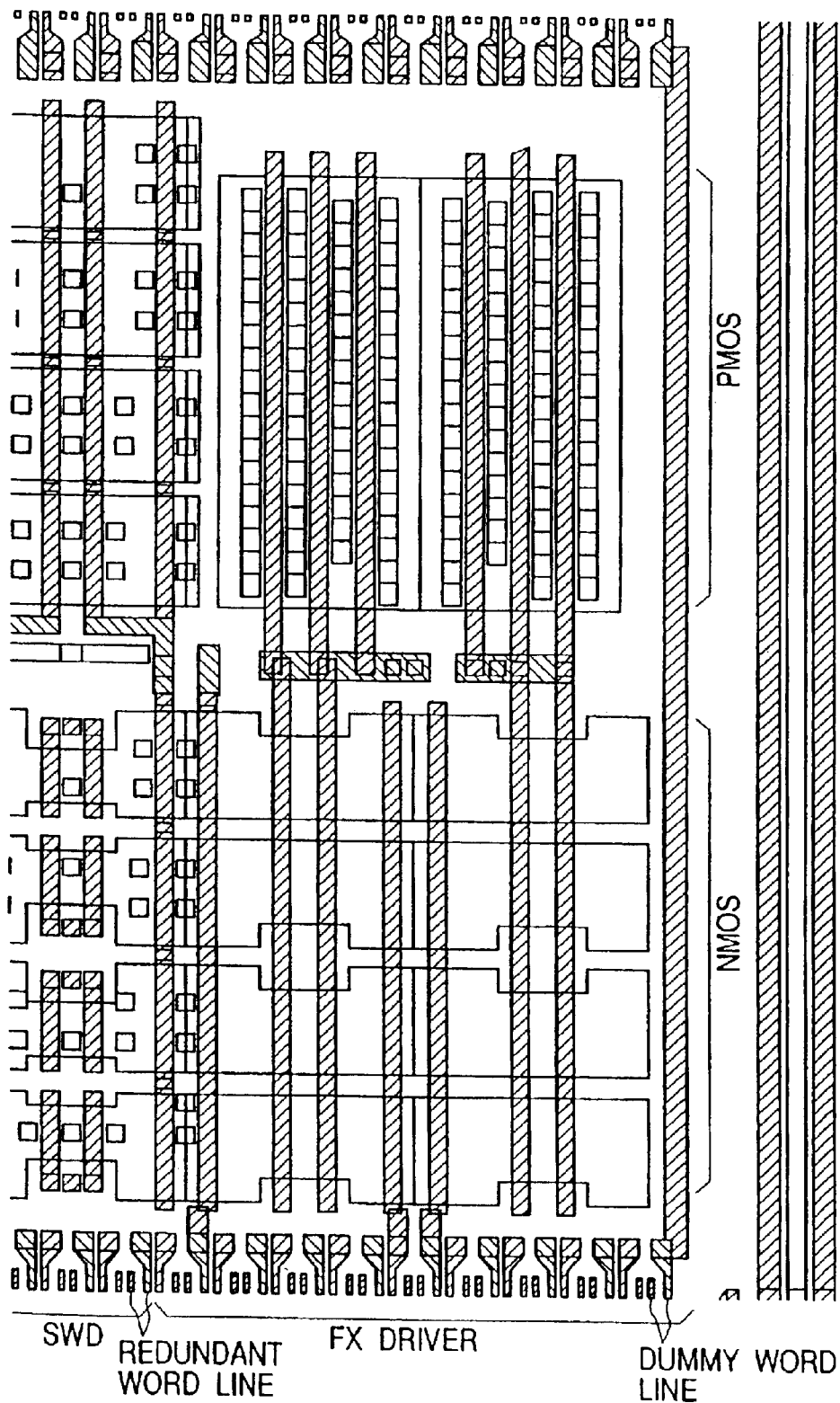
FIG. 23 is a layout diagram showing one embodiment of the FX driver and the sub-word driver according to the present invention.

FIG. 23 is a layout diagram of one embodiment of an FX driver and a sub-word driver according to the present invention. The FX driver forms operational voltages of a plurality of sub-word drivers so that it includes an N channel type MOSFET (NMOS) and a P channel type MOSFET (PMOS) larger than MOSFETs included in the sub-word driver shown in FIG. 23, for illustrative purposes. In order to form the FX driver with large size MOSFETS, as described above, 36 word lines formed in an end mat are used as dummy word lines. The FX driver is formed in a sub-word driver region corresponding thereto.

Figure 24:
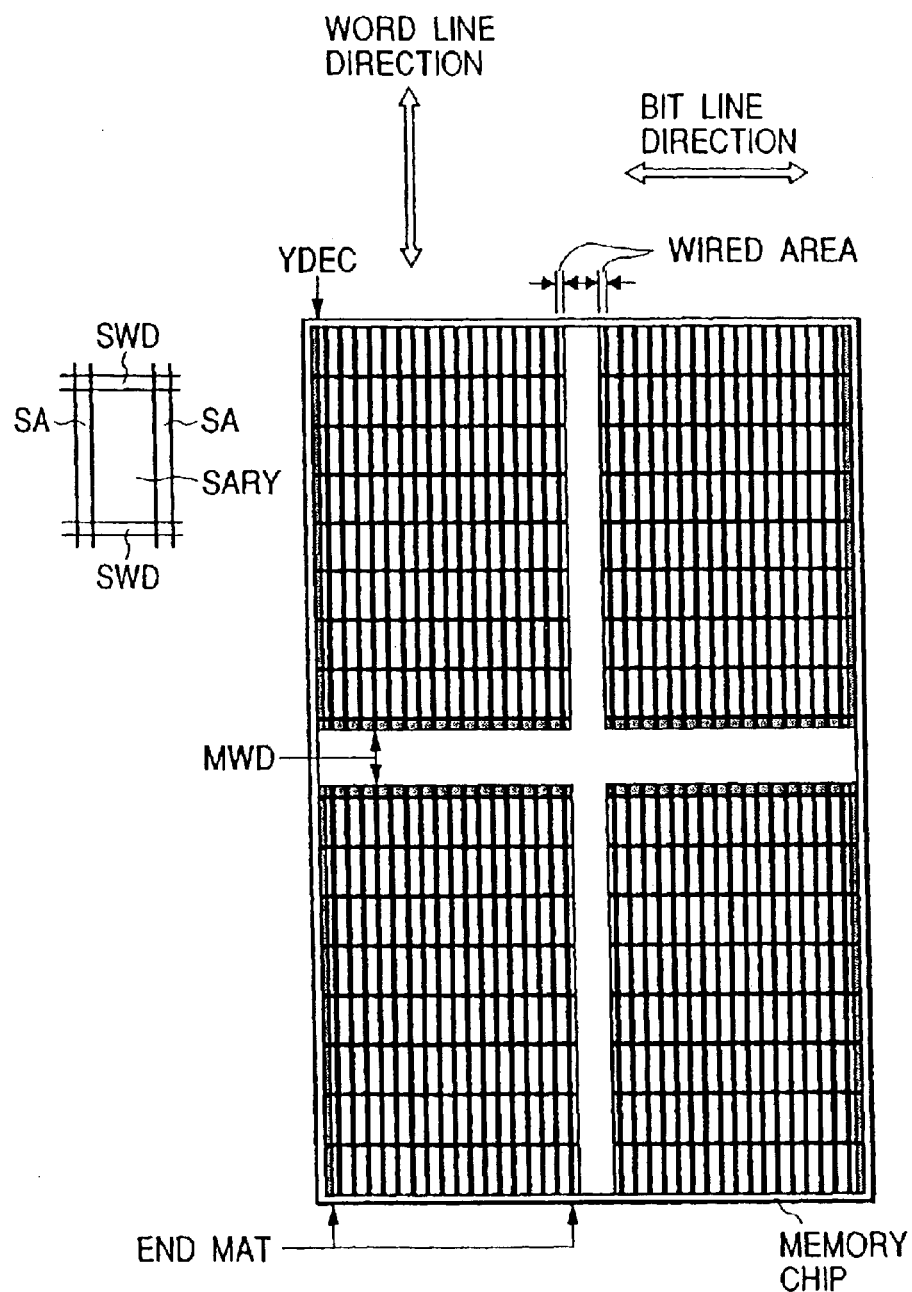
FIG. 24 is a schematic layout diagram showing another embodiment of the DRAM according to the present invention.

FIG. 24 is a schematic layout diagram of another embodiment of a dynamic type RAM according to the present invention. In this embodiment, a memory array is divided into, but not limited to, four as a hole. Thus, two memory arrays are provided separately in the longitudinal direction of the semiconductor chip and two memory arrays are provided separately in the lateral direction of the semiconductor chip. Those described above are the same as the embodiments of FIGS. 1 and 20.

In this embodiment, word lines are placed along the chip in the longitudinal direction, and bit lines are placed along the chip in the lateral direction. In other words, the directions of the bit lines and word lines are opposite to those in FIGS. 1 and 20. In each memory array divided into four as a whole including two vertically and two horizontally with respect to the longitudinal direction of the semiconductor chip as described above, X-system pre-decoder and relief circuits and Y-system predecoder and relief circuits, for example, are placed at the middle portion with respect to the longitudinal direction. A main word driver area MWD is formed along the middle portion of the memory array and drives main word lines which are extended toward the bottom or the top in accordance with each memory array.

In the memory array, a Y decoder Y DEC is provided on the periphery of the chip, which is opposite to the chip center portion. The memory array is divided into a plurality of memory mats as described above. The memory mat is formed by being surrounded and sandwiched by sense amplifier areas and sub-word driver areas. The cross portion of the sense amplifier area and the sub-word driver area is called a cross area. The sense amplifier is provided in the sense amplifier area based on the one-cross point method and staggered positioning.

A select operation by the Y system is transmitted to the Y decoder placed on the periphery of the chip through an address buffer provided in the center part of the chip via a relief circuit and the predecoder provided in the middle portion of the memory array. Then, a Y select signal is formed in the Y decoder YDEC. A bit line of one memory mat array is selected by the Y select signal. Then, it is transmitted to a main amplifier MA provided in the chip center part on the opposite side and is amplified and output through an output circuit provided in the chip center part.

In this configuration, it may be seen that signals are routed in the chip, so that a longer time to output a readout signal. However, an address signal needs to be input as it is in the relief circuit. Thus, when the relief circuit is placed in he chip center, the output timing by the predecoder is determined based on the check results regarding whether or not it is a failed address. In other words, when the predecoder and the relief circuit are spaced away from each other, signal delays may cause a delay in the actual Y select operation.

In the signal transmission path for reading-out signals in the memory array, according to a layout scheme where the Y decoder exists at the center part of the chip, when performing reading-out from complementary bit lines of the memory mat on the periphery of the chip on the opposite side, the amount of time needed for traversing the memory array in order to transmit the Y select signal is added to the amount of time needed for the readout signal from the complementary bit lines of the memory mat on the periphery of the chip to traverse the memory array in the direction opposite to the direction of the Y select signal through an input/output line, in order to be transmitted to the main amplifier are added.

In other words, in the worst case, it takes a longer time due to the flow of a signal making one round trip to the memory array. However, according to the present invention, the main amplifier MA and the Y decoder YDEC are placed on both sides of the memory array. Therefore, the sum of signal transmission path times for selecting complementary bit lines of the memory mat and the signal transmission path from selected complementary bit lines to the input of the main amplifier MA through the input/output line can be reduced to half of the one round trip path time because the signal transmission path according to the present invention only traverses the memory array even if either complementary bit line is selected.

In the layout as described above, it is further advantageous that the end mats are aligned in the longitudinal direction of the chip close to the center of the chip. When the sense amplifier is placed in the one cross point method and in the staggered manner, the memory array ends with the memory cell. In other words, according to the conventional two cross points method, the memory array ends with a sense amplifier. Thus, the Y select line needs to be extended to the sense amplifier. on the other hand, according to the one cross point method as described in this embodiment, the memory array ends with memory cell. Therefore, the Y select line can be terminated at the sense amplifier array provided between a general mat and an end mat.

According to this configuration, a Y select line does not exist in the area where an end mat is formed. As a result, in the cross section in FIG. 3B, a second metal wiring layer M2 and a third metal layer M3 are used for the Y select line and the main word line. However, either one of the second or third wire used as the Y select line on the end mat is in the idle state. Thus, the second or third wire corresponding to the Y select line on the end mat may be used as a signal wire for peripheral circuits provided in the center part.

With an increase in the functions of the dynamic RAM, the peripheral circuits provided at the center of the chip needs to be configured with a random logic circuit and a more complicated signal line has to be formed, rather than a regular circuit configuration, such as a memory array. In other words, in the dynamic RAM, wires are extremely congested and many signal lines are needed. Therefore, using an area on the end mat as the wiring area can virtually reduce the number of wires in the chip center area. In the mat configuration as described above, nearly 100 signal lines can be formed, and nearly 200 wires are extended to the end mat array direction in the most congested area in the peripheral circuit. Therefore, it is meaningful to use the end mat as the wiring area.

Figure 25:
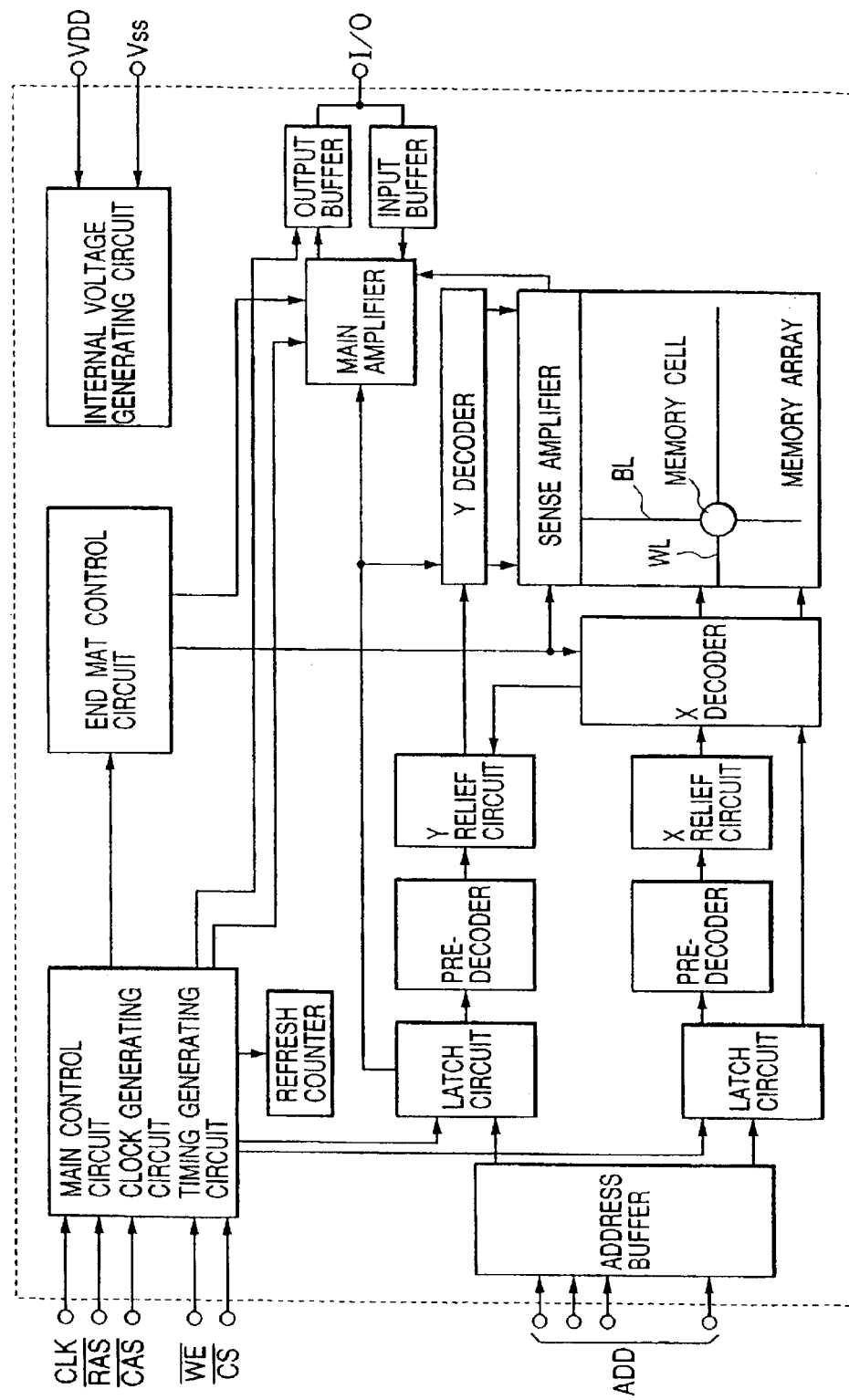
FIG. 25 is an overall block diagram showing one embodiment of the DRAM according to the present invention.

FIG. 25 is an overall block diagram of one embodiment of the dynamic RAM according to the present invention. Control input signals include a row address strobe signal RAS, column address strobe signal/CAS, write enable signal/WE and output enable signal/OE, where "/" is an over-bar of a logic symbol indicating the low level is at the active level. X address and Y address signals are input from a common address terminal Add in time series simultaneously with the row address strobe signal/PAS and the column address strobe signal/CAS.

The X address and Y address signals input through an address buffer are captured by a latch circuit. The X address signal captured in the latch circuit is supplied by a predecoder as described above. The output signal is supplied to an X decoder and a select signal for the word line WL is formed. With the operation for selecting a word line, a readout signal as described above appears in the complementary bit lines of a memory array and a sense amplifier performs an amplifying operation. The Y address signal captured in the latch circuit is supplied to a predecoder as described above. The output signal is supplied to an Y decoder and a select signal for the bit line DL is formed. X and Y relief circuits store a failed address and compare the stored failed address and the captured address signal. If they match, the X and Y relief circuits instruct the X or Y decoder to select a spare word line to or bit line inhibit the selection of the regular word line or regular bit line.

The one selected by the column switch circuit, not shown, is connected to the common input/output line and the stored information amplified by the sense amplifier is transmitted to the main amplifier. The main amplifier is, but not limited thereto, an amplifier, which can be also used as a write circuit. In other words, during the readout operation, readout signals read out through the Y switch circuit are amplified and output from an external terminal I/O through an output buffer. During the write operation, write signals input from the external I/O are captured through the input buffer, and transmitted to the common input/output line and the select bit line through the main amplifier. In the select bit line, the write signal is transmitted by the amplifying operation by the sense amplifier, and charges corresponding to them are held in the capacitor in the memory cell.

A clock generator circuit (main control circuit) generates each of various kinds of timing signals needed for the select operation for a memory cell, such as a capture control timing signal for an address signal input in with the signals /RAS and /CAS and/or an operation timing signal for the sense amplifier. An internal power supply generator circuit receives an operational voltage, such as Vcc and Vss, supplied from the power supply terminal and generates each of the internal voltages, such as the plate voltage. a precharge voltage, such as Vcc/2, internal step-up voltage VCH, internal step-down voltage VDL, and substrate back bias voltage VBB. A refresh counter generates an address signal for refreshing and is used for the selection operation of the X system in the refresh mode.

In this embodiment, an end mat control circuit is provided. Thus, when it is arranged that reading-out and/or writing-in are also performed on the end mat and when two word lines corresponding to end mats are selected, switching the main amplifier in accordance with it and switching the IO switch circuit for avoiding data collision as described above are also performed. When an end mat is used as a redundancy circuit, a word line of the end mat can be selected with a signal from the X relief circuit. Thus, the end mat control circuit can be replaced by that.

Operational effects, which may be obtained from the embodiments described above, are as follows:

(1) A dynamic RAM according to an aspect of the present invention includes a plurality of memory mats including a plurality of bit lines, a plurality of word lines, and a plurality of memory cells coupled to the plurality of bit lines and the plurality of word lines, the plurality of memory mats being arranged in the direction of the bit line, and a sense amplifier array including a plurality of latch circuits being provided in areas between the memory mats arranged in the bit line direction, respectively, and a pair of input/output nodes of which are connected to half of the bit lines provided in the memory mats. In this case, for a general memory mat other than both end portions in the bit line direction, word lines in any one of the memory mats may be activated while, for end memory mats provided on both end portions in the bit line direction, word lines of both memory mats may be activated concurrently. Thus, an operational margin of the sense amplifier can be allocated, and, further, an area occupied per bit can be smaller as a result of effective use of the end mats.

(2) Further, a bit line in the end memory mat may be formed by using an area twice as long as the bit line pitch of the bit line of the general memory mat, and its length in the bit line extending direction may be shorter than the length of the general memory mat in the bit line extending direction. Thus, the occupied area in the end mat can be smaller.

(3) Further, a bit line in the end memory mat may be formed by being folded at a distance equal to or more than half of the general memory mat from a connection portion with the latch circuit of the sense amplifier array. Thus, the occupied area in the end mat can be smaller, and, further, the amount of signals can be larger when stored information is read out also from the end mat.

(4) Further, the end memory mat bit line may include a combination of a first bit line pair including two bit lines branching off at intervals twice as long as the bit line pitch from a connection portion with the latch circuit of the sense amplifier array and extending to a half length of the bit line of the general memory mat, and a second bit line pair extending linearly to half the length of the bit line of the general memory mat from the connection portion with the latch circuit of the sense amplifier array and being folded back therefrom so as to be sandwiched by the first bit line pair. Thus, when wires are formed based on the phase shift method, the first and the second bit lines can be formed integrally.

(5) Further, the gates of MOSFETs of two memory cells connected to one bit line may be connected to the word line of the end memory mat. Thus, the occupied area in the end mat can be smaller, and, further, the amount of signals can be larger when stored information is read out also from the end mat.

(6) Further, the dynamic RAM may include a plurality of first complementary input/output lines extended along the sense amplifier array, and the sense amplifier array may include a pre-charge circuit for supplying a pre-charge voltage corresponding to a middle voltage of an operational voltage of the sense amplifier to the complementary bit line pair and a column switch MOSFET. Thus, each element needed for selecting a memory cell can be placed rationally.

(7) The dynamic RAM may further include second complementary input/output lines 1 and 2 in common in accordance with the plurality of memory mats, whereby first complementary input/output lines provided in a sense amplifier array corresponding to one end memory mat are connected to the second complementary input/output lines, and a selector switch whereby, first complementary input/output lines provided in a sense amplifier array corresponding to the other end memory mat are connected to the second complementary input/output line 1 when a bit line of a general memory mat is selected, and are connected to the second complementary input/output line 2 when a bit line in the end memory mat is selected. Thus, data collision can be prevented for the end mat and data can be written in or read out.

(8) Further, word lines may be divided into virtually two sets at a center memory mat provided in a center portion among memory mats placed in the bit line extending direction, and an operation for selecting a memory cell may be performed by combination of half of the bit lines in the center memory mat and bit lines in the end memory mat. Thus, data can be input/output for more memory cells.

(9) Further, a timing control may be performed so that the amplification speed of the sense amplifier gets slower when a word line in the end memory mat is selected. Thus, the reading out operation from the general mat can be matched.

(10) Further, the dynamic RAM may have a hierarchical structure including the word line including a main word line and a sub-word line divided into several parts in an extending direction of the main word line, and may further include a sub-word driver in accordance with the divided sub-word lines. Preferably, in this case. a plurality of the sub-word lines are allocated to the main word line, and the sub-word driver receives a signal of the main word line and a signal of a sub-word select line to select one sub-word line among a plurality of the sub-word select lines.

(11) Still further, a memory cell provided in the end memory mat may be used as a redundant memory cell used for relieving a failed memory cell. Thus, the larger signal amount can allow a higher relief efficiency for failed word lines.

(12) Further, a preparation operation for the word line selection in a row system selector circuit provided in accordance with the end memory mat may be performed at the same timing as a preparation operation for the word line selection in a row system selector circuit provided in a general memory mat. Thus, it allows faster memory access.

(13) Further, a memory cell provided in the end memory mat may be as a redundant memory cell use for relieving a failed memory cell, and a driver circuit of the sub-word select line may be formed in a part of the area where a sub-word driver is formed and a bit line provided in an end memory mat corresponding to the driver circuit may be used as a dummy word line. Thus, an area occupied by the selector circuit in the end mat can be smaller.

(14) A dynamic RAM according to another aspect of the present invention includes a plurality of memory mats including a plurality of bit lines, a plurality of word lines, and a plurality of memory cells coupled to the plurality of bit lines and the plurality of word lines, the plurality of memory mats being arranged in the direction of the bit line, and a sense amplifier array including a plurality of latch circuits being provided in areas between the memory mats arranged in the bit line direction, respectively, and a pair of input/output nodes of which are connected to half of the bit lines provided in the memory mats. In this case, for end memory mats provided on both end portions, the bit lines may be used as a fixed voltage for keeping the MOSFET OFF for forming a reference voltage and an area equal to two bit line pitches for the bit lines of the general memory mat may be used so that its total length and number of memory cells to be connected are virtually the same as the bit line of the general memory mat. Thus, the operational margin of the sense amplifier can be allocated and further the occupied area can be smaller.

(15) Further, in that case, the bit lines in the end memory mat may be formed by being folded at a distance equal to half of the general memory mat from a connection portion with the latch circuit of the sense amplifier array. Thus, the operational margin of the sense amplifier can be allocated, and, further, the occupied area can be smaller.

(16) Further, the end memory mat bit line may include a combination of a first bit line pair branching off at intervals twice that of a bit line pitch from a connection portion with the latch circuit of the sense amplifier array and extending to a length half that of the bit line of the general memory mat and a second bit line pair extending linearly to the length half that of the bit line of the general memory mat from the connection portion with the latch circuit of the sense amplifier array and being folded back therefrom so as to be sandwiched by the first bit line pair. Thus, when wires are formed based on the phase shift method, the first and the second bit lines can be formed integrally.

(17) Further, in this case, a plurality of sets of the plurality of memory mats may be provided in the bit line direction and in the word line direction in order to constitute one memory array. Also, preferably, at least two of the memory arrays are carried by a semiconductor chip, and a column selector circuit for forming a select signal of the bit line is provided adjacent to one end memory mat in a memory array corresponding to an end portion of the semiconductor chip. In addition, a wiring layer, which is the same as a wiring layer for transmitting a selector signal of the bit line on the other end memory mat, may be used as a part of a wiring layer of a peripheral circuit provided in a semiconductor chip center portion sandwiched by the two memory arrays. As a result, it can ease wiring in the chip center portion sandwiched by the two memory arrays.

While the invention made by the inventor hereof has been described based on its preferred embodiments, it should be understood that the present invention is not limited to each of those embodiments, and that various changes and modifications may be made without departing from the spirit and scope of the invention. For example, the word line may constitute a two layer structure along with a metal layer instead of the hierarchical word line method. The input/output interface of the dynamic PAM may be adjusted for various devices such as DDR SDRAM and SDRAM. The dynamic RAM may be built in a digital integrated circuit. The present invention can be utilized widely for a dynamic RAM and a semiconductor device where sense amplifiers are arranged in a staggered manner based on the one cross point method.

Effects which can be obtained from the typical aspect of the present invention disclosed herein may be described in brief as follows: There are a plurality of memory mats including a plurality of bit lines, a plurality of word lines, and a plurality of memory cells coupled to the plurality of bit lines and the plurality of word lines, the plurality of memory mats being arranged in the direction of the bit line, and a sense amplifier array including a plurality of latch circuits being provided in areas between the memory mats arranged in the bit line direction, respectively, and a pair of input/output nodes of which are connected to half of the bit lines provided in the memory mats, wherein, for a general memory mat, other than both end portions in the bit line direction, word lines in any one of the memory mats are activated while, for end memory mats provided on both end portions in the bit line direction, the word lines of both memory mats are activated concurrently. Thus, the operational margin of the sense amplifier can be allocated, and, further, the occupied area per bit can be smaller as a result of effective use of the end mats.

What is claimed is:

1. A semiconductor memory comprising:

a plurality of first regions arranged along a first direction, each of which corresponds to a memory array including a plurality of word lines extending in a second direction perpendicular to said first direction, a plurality of bit lines extending in said first direction and a plurality of memory cells; and a plurality of second regions, each of which is arranged alternately with respect to each of said first regions arranged along said first direction and each including sense amplifiers connected to said bit lines to form an open bit line type semiconductor memory, wherein two of the first regions at end portions of said plurality of first regions are both selected together, and wherein one of the first regions at an inner portion of said plurality of first regions is selected independently.

2. A semiconductor memory according to claim 1, wherein one of said word lines in a selected first region is activated.

3. A semiconductor memory comprising:

a plurality of memory arrays arranged along a first direction, each of which includes a plurality of word lines extending in a second direction perpendicular to said first direction, a plurality of bit lines extending in said first direction and a plurality of dynamic memory cells; and a plurality of sense amplifiers, each of which is arranged alternately with respect to each of said memory arrays arranged along said first direction, each of which sense amplifier includes latch circuits connected to said bit lines to form an open bit line type semiconductor memory, wherein two memory arrays at end portions of the plurality of memory arrays are both selected together, wherein one of the memory arrays at an inner portion of the plurality of memory arrays is selected independently, and wherein one of said word lines in a selected memory array is activated.

* * * * *